(12) United States Patent
Hattori et al.

(10) Patent No.: US 11,437,596 B2
(45) Date of Patent: Sep. 6, 2022

(54) ORGANIC PHOTOELECTRONIC ELEMENT HAVING HOLE TRANSPORT LAYER CONTAINING FLUORINATED POLYMER AND ORGANIC SEMICONDUCTOR MATERIAL

(71) Applicants: AGC Inc., Chiyoda-ku (JP); National University Corporation Yamagata University, Yamagata (JP)

(72) Inventors: Shigeki Hattori, Chiyoda-ku (JP); Takefumi Abe, Chiyoda-ku (JP); Kaori Tsuruoka, Chiyoda-ku (JP); Yasuhiro Kuwana, Chiyoda-ku (JP); Daisuke Yokoyama, Yonezawa (JP)

(73) Assignees: AGC Inc., Chiyoda-ku (JP); National University Corporation Yamagata University, Yamagata (JP)

( * ) Notice: Subject to any disclaimer, the term of this patent is extended or adjusted under 35 U.S.C. 154(b) by 325 days.

(21) Appl. No.: 16/779,740

(22) Filed: Feb. 3, 2020

(65) Prior Publication Data

US 2020/0168829 A1    May 28, 2020

Related U.S. Application Data

(63) Continuation of application No. PCT/JP2018/031235, filed on Aug. 23, 2018.

(30) Foreign Application Priority Data

Aug. 24, 2017    (JP) .............................. JP2017-161639

(51) Int. Cl.
*H01L 51/50* (2006.01)
*C08L 27/16* (2006.01)

(52) U.S. Cl.
CPC .......... *H01L 51/5004* (2013.01); *C08L 27/16* (2013.01); *H01L 51/5012* (2013.01); *H01L 51/5056* (2013.01)

(58) Field of Classification Search
CPC ............. H01L 51/5004; H01L 51/5012; H01L 51/5056; C08L 27/16
(Continued)

(56) References Cited

U.S. PATENT DOCUMENTS

| | | | |
|---|---|---|---|
| 2014/0117332 A1* | 5/2014 | Lee | ..................... H01L 51/5064 257/40 |
| 2017/0369727 A1* | 12/2017 | De Campo | ............. C08L 27/16 |
| 2018/0033990 A1* | 2/2018 | Kim | ..................... H01L 51/5096 |

FOREIGN PATENT DOCUMENTS

| | | | |
|---|---|---|---|
| JP | 2002-175887 A | 6/2002 | |
| JP | 2006-237083 A | 9/2006 | |

(Continued)

OTHER PUBLICATIONS

International Search Report dated Nov. 27, 2018 in PCT/JP2018/031235 filed on Aug. 23, 2018, 2 pages.

*Primary Examiner* — Xia L Cross
(74) *Attorney, Agent, or Firm* — Oblon, McClelland, Maier & Neustadt, L.L.P.

(57) ABSTRACT

To provide an organic photoelectronic element excellent in light emitting characteristics and long-term reliability. The organic photoelectronic element comprises a substrate, an anode provided on the substrate, a cathode facing the anode, a light emitting layer disposed between the anode and the cathode, a hole transport layer disposed between the light emitting layer and the anode, and an electron blocking layer provided in contact with the light emitting layer and the hole transport layer between the light emitting layer and the hole transport layer, wherein the hole transport layer contains a fluorinated polymer and an organic semiconductor material, (Continued)

and has a refractive index in the wavelength range of from 450 nm to 800 nm, of at most 1.60, the hole transport layer and the electron blocking layer are made of different materials from each other, and the LUMO energy level of the electron blocking layer is higher than the LUMO energy level of the light emitting layer and the LUMO energy level of the hole transfer layer.

15 Claims, 6 Drawing Sheets

(58) Field of Classification Search
 USPC .......................................................... 257/40
 See application file for complete search history.

(56) References Cited

FOREIGN PATENT DOCUMENTS

| | | |
|---|---|---|
| JP | 2008-270731 A | 11/2008 |
| WO | WO 2006/008977 A1 | 1/2006 |
| WO | WO 2013/108618 A1 | 7/2013 |
| WO | WO 2016/100313 A1 | 6/2016 |
| WO | WO 2016/204275 A1 | 12/2016 |

* cited by examiner

Stacking direction

ORGANIC PHOTOELECTRONIC ELEMENT HAVING HOLE TRANSPORT LAYER CONTAINING FLUORINATED POLYMER AND ORGANIC SEMICONDUCTOR MATERIAL

TECHNICAL FIELD

The present invention relates to an organic photoelectronic element.

BACKGROUND ART

Heretofore, as a self-emission type element, an organic photoelectronic element (organic electroluminescent element, hereinafter, organic EL element) is known. The organic EL element has, as the basic structure, a structure in which plural types of layers such as a light emitting layer, an electron transport layer, a hole transport layer, etc. are laminated between a pair of electrodes.

The organic EL element emits light, as photons are generated by recombination of electrons supplied from a power source and holes in the internal light emitting layer. In the field of organic EL elements, by the research and development over the years, the "internal quantum efficiency" being the percentage of "photons generated inside of the element" to "the number of injected electrons" has reached close to 100%.

On the other hand, even with organic EL elements in recent years, the "external quantum efficiency" being the percentage of "photons extracted to outside of the element" to "the number of injected electrons" remains to be only about from 20 to 30%, and an improvement is desired.

As one of causes as to why the external quantum efficiency is low, internal reflection is considered due to a difference in refractive indexes of the respective layers constituting the organic EL element. As described above, the organic EL element has plural types of layers in addition to the light emitting layer. These layers have refractive indexes different from one another. Therefore, light generated in the light emitting layer is considered to be reflected at the interfaces between the layers having different refractive indexes and damped or absorbed inside of the element before it is emitted to outside of the element.

Whereas an organic EL element is known in which, by incorporating nano-sized porous silica particles in the charge transport layer, the refractive index of the charge transport layer has been reduced (see Patent Document 1). By the organic EL element described in Patent Document 1, it is expected that reflection occurring at the interface between the charge transport layer and the layer in contact with the charge transport layer, is suppressed, whereby the external quantum efficiency will be improved.

PRIOR ART DOCUMENT

Patent Document

Patent Document 1: WO2013/108618

DISCLOSURE OF INVENTION

Technical Problems

At the time when holes and electrons are recombined in the light emitting layer, the position of the recombination, i.e. the light emitting position, tends to vary depending on the materials constituting the respective layers. In the organic EL element described in Patent Document 1, although the refractive index of the charge transport layer is lowered by incorporating porous silica particles in the charge transport layer, the charge transport properties are different between the charge transport layer having the refractive index lowered, and the charge transport layer formed only by a semiconductor material. Therefore, in the organic EL element described in Patent Document 1, there is such a possibility that along with the control of the refractive index of the charge transport layer, the recombination position in the light emitting layer is changed, whereby the light emitting characteristics and the long-term reliability of the organic EL element are likely to be lowered. Further, even if the charge transport layer is made to have a low refractive index, unless the light emitting position is fixed, effective light extraction effects by lowering the refractive index may not be obtainable, and the light emitting characteristics may not be improved.

The present invention has been made in view of such circumstances, and an object thereof is to provide an organic photoelectronic element excellent in the light emitting characteristics and long-term reliability.

Solution to Problems

In order to solve the above problems, one embodiment of the present invention provides an organic photoelectronic element comprising a substrate, an anode provided on the substrate, a cathode facing the anode, a light emitting layer disposed between the anode and the cathode, a hole transport layer disposed between the light emitting layer and the anode, and an electron blocking layer provided in contact with the light emitting layer and the hole transport layer between the light emitting layer and the hole transport layer, wherein the hole transport layer contains a fluorinated polymer and an organic semiconductor material, and has a refractive index in the wavelength range of from 450 nm to 800 nm, of at most 1.60, the hole transport layer and the electron blocking layer are made of different materials from each other, and the LUMO energy level of the electron blocking layer is higher than the LUMO energy level of the light emitting layer and the LUMO energy level of the hole transfer layer.

In one embodiment of the present invention, the construction may be made such that the energy difference between the LUMO energy level of the electron blocking layer and the LUMO energy level of the light emitting layer, is larger than the energy difference between the LUMO energy level of the hole transport layer and the LUMO energy level of the light emitting layer.

In one embodiment of the present invention, the construction may be made such that the energy difference between the LUMO energy level of the electron blocking layer and the LUMO energy level of the light emitting layer, is larger than 0.5 eV.

In one embodiment of the present invention, the construction may be made such that the film thickness of the electron blocking layer is from 5 nm to 30 nm.

In one embodiment of the present invention, the construction may be made such that the volume ratio of the content (A) of the fluorinated polymer to the content (B) of the organic semiconductor material in the hole transport layer is (A):(B)=from 70:30 to 5:95.

In one embodiment of the present invention, the construction may be made such that the hole transport layer is a physical vapor deposition layer.

Advantageous Effects of Invention

According to the present invention, it is possible to provide an organic photoelectronic element excellent in the light emitting characteristics and long-term reliability.

DESCRIPTION OF EMBODIMENTS

First Embodiment

Hereinafter, with reference to FIGS. 1 to 3, an organic photoelectronic element according to the first embodiment of the present invention will be described. In all drawings of the following, in order to facilitate visualization of the drawings, the dimensions and ratios of the respective components are varied as appropriate.

Figure 1:
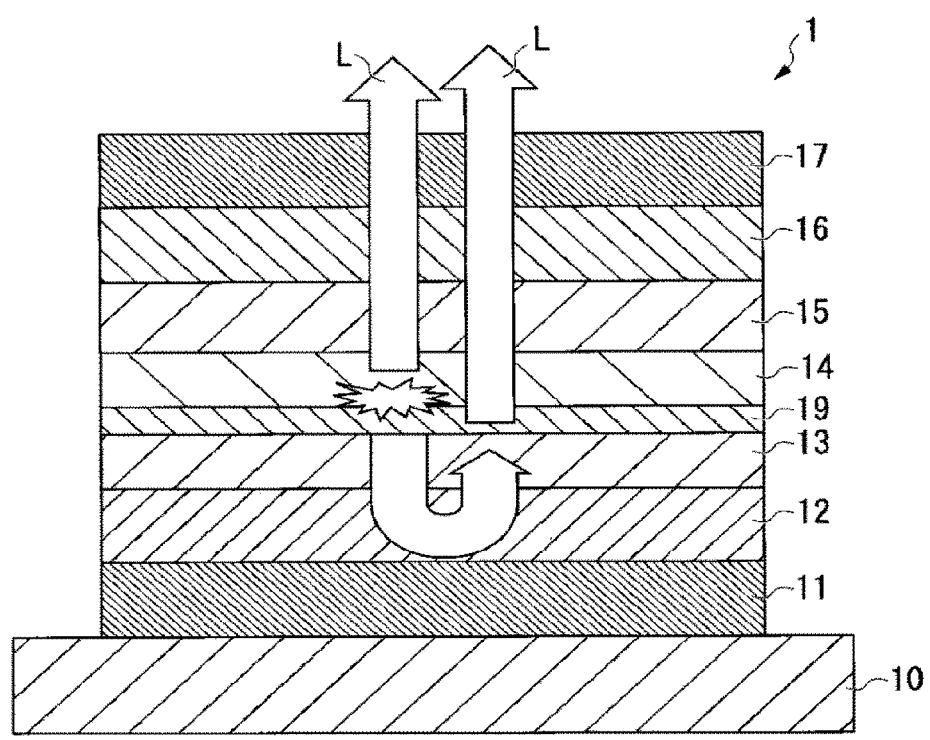
FIG. 1 is a schematic cross-sectional view showing organic EL element 1 according to the first embodiment of the present invention.

FIG. 1 is a schematic cross-sectional view showing organic photoelectronic element (organic EL element) 1 in the first embodiment of the present invention. The organic EL element 1 has a structure in which a substrate 10, an anode 11, a hole injection layer 12, a hole transport layer 13, an electron blocking layer 19, a light emitting layer 14, an electron transport layer 15, an electron injection layer 16 and a cathode 17 are laminated in this order. The organic EL element 1 of this embodiment employs a top emission system in which light L generated in the light emitting layer 14 is emitted to the outside via the cathode 17.

(Substrate)

The substrate 10 may be provided with optical transparency, or may not be provided with optical transparency. As the material for forming the substrate 10, it is possible to use an inorganic substance such as glass, quartz glass or silicon nitride, or an organic polymer (resin) such as an acrylic resin or a polycarbonate resin. Further, so long as the insulating property of the surface is secured, it is possible to employ a metal material as the material for forming the substrate 10.

Further, the substrate 10 is provided with various wirings or a driving element (not shown) to be electrically connected to the organic EL element.

(Anode)

The anode 11 is formed on the substrate 10 and supplies holes to the hole transport layer 13. The anode 11 has light reflectivity for reflecting light emitted from the light emitting layer 14. As the material for forming the anode 11, it is possible to use an electrically conductive metal oxide such ITO (Indium Tin Oxide: indium-doped tin oxide) or IZO (Indium Zinc Oxide: indium-doped zinc oxide). Further, in order to impart light reflectivity to the anode 11, on the substrate 10 side of the anode 11, a reflective film made of a metal material is provided. That is, the anode 11 has a layered structure comprising the layer made of an electrically conductive metal oxide and the reflective film.

Further, as a material for forming the anode 11, it is also possible to use silver.

The thickness of the anode 11 is not particularly limited, but is preferably from 30 to 300 nm. The thickness of the anode 11 is, for example, 100 nm.

(Hole Injection Layer)

The hole injection layer 12 is formed between the anode 11 and the hole transport layer 13. The hole injection layer 12 has a function to facilitate injection of holes from the anode 11 to the hole transport layer 13. Here, the hole injection layer 12 may not be formed.

The hole injection layer 12 may be formed by using a known semiconductor material. As such a material, for example, the following semiconductor materials may be mentioned.

A metal oxide such as molybdenum oxide or tungsten oxide;

an organometallic complex material such as copper phthalocyanine;

an arylamine material such as di-[4-(N,N-ditolyl-amino)-phenyl]cyclohexane (TAPC), $N^1,N^1,N^3,N^3$-tetra-m-tolyl-benzene-1,3-diamine (PDA), N,N'-diphenyl-N,N'-di(m-tolyl)benzidine (TPD), N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), N,N'-di(1-naphthyl)-N,N'-diphenyl benzidine (NPB), 4,4',4"-tris(N,N-diphenylamino)triphenylamine (TDATA), dipyrazino[2,3-f:2',3'-h]quinoxaline-2,3,6,7,10,11-hexacarbonitrile (HAT-CN), 9,9',9"-triphenyl-9H,9'H,9"H-3,3':6',3"-tercarbazole (Tris-PCz), or 4,4',4"-tris(N-(naphthalen-2-yl)-N-phenyl-amino)triphenylamine (2-TNATA);

a polymer semiconductor material such as polyaniline/dodecylbenzenesulfonic acid (PANI/DBSA), poly(3,4-ethylenedioxythiophene)/poly(4-styrenesulfonate) (PEDOT/PSS), polyaniline camphorsulfonic acid (PANI/CSA), or polyaniline/poly(4-styrenesulfonate) (PANI/PSS);

a commercially available product such as N-(diphenyl-4-yl)-9,9-dimethyl-N-(4-(9-phenyl-9H-carbazoyl-3yl) phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled), NHT-51 (manufactured by Novaled), NDP-2 (manufactured by Novaled), or NDP-9 (manufactured by Novaled).

As such a material for forming the hole injection layer 12, a commercially available product may be used, or a synthetic product may be used. Further, as the material for forming the hole injection layer 12, one type may be used alone, or two or more types may be used in combination.

Further, the hole injection layer 12 may contain a dopant to facilitate the transfer of charges to and from a fluorinated polymer and an organic semiconductor material as described below. Specific examples of the dopant for the hole-injecting material may be an organic dopant such as TCNQ, $F_4$-TCNQ, PPDN, TCNNQ, $F_6$-TCNNQ, HAT-CN, HATNA, HATNA-Cl6, HATNA-F6, $C_{60}F_{36}$, $F_{16}$—CuPc, NDP-2 (manufactured by Novaled), or NDP-9 (manufactured by Novaled), and an inorganic dopant such as $MoO_3$, $V_2O_5$, $WO_3$, $ReO_3$ or CuI. As the organic semiconductor material, one type may be used alone, or two or more types may be used in combination. Also as the fluorinated polymer, one type may be used alone, or two or more types may be used in combination.

The thickness of the hole injection layer 12 is not particularly limited, but from 1 to 300 nm is preferred. The thickness of the hole injection layer 12 is, for example, 5 nm.

(Hole Transport Layer)

The hole transport layer 13 is formed on the hole injection layer 12. Here, in a case where there is no hole injection layer 12, the hole transport layer 13 is formed on the anode 11. The hole transport layer 13 has a function to satisfactorily transport holes injected from the anode 11 towards to the light emitting layer 14.

The hole transport layer 13 contains an organic semiconductor material and a fluorinated polymer. The hole transport layer 13 may be a single layer or may be a laminate of a plurality of layers. Further, it may contain a dopant as a third component.

The hole transport layer 13 contains the fluorinated polymer which has a low refractive index as compared to the organic semiconductor material, and thus, has a low refractive index as compared to a hole transport layer composed solely of an organic semiconductor material. The refractive index of the hole transport layer 13 in the wavelength range of from 450 to 800 nm is at most 1.60, preferably at most 1.55, more preferably at most 1.50, and from the viewpoint of securing electrical conductivity, it is preferably at least 1.3, more preferably at least 1.4.

The hole transport layer 13 preferably has a lower refractive index than the light emitting layer 14 in the wavelength range of from 450 to 800 nm. The refractive index of the light emitting layer 14 may be adjusted by controlling the mixing ratio of the organic semiconductor material and the fluorinated polymer in the hole transport layer 13. As the hole transport layer 13 has a lower refractive index, the light extraction efficiency generated internally of the organic EL element 1 will be improved.

(Organic Semiconductor Material)

As the organic semiconductor material being a material for forming the hole transport layer 13, it is possible to employ a compound known as a hole transporting material to receive and transport holes injected from the anode.

As the hole transporting material, an aromatic amine derivative may be preferably exemplified. As specific examples, the following α-NPD, TAPC, PDA, TPD, m-MT-DATA, etc. may be mentioned.

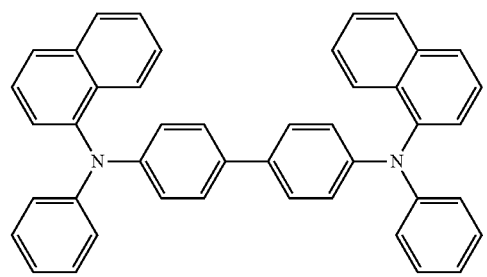

α-NPD

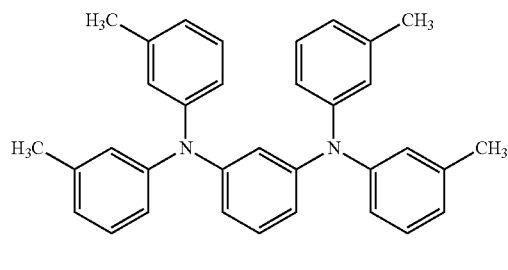

PDA

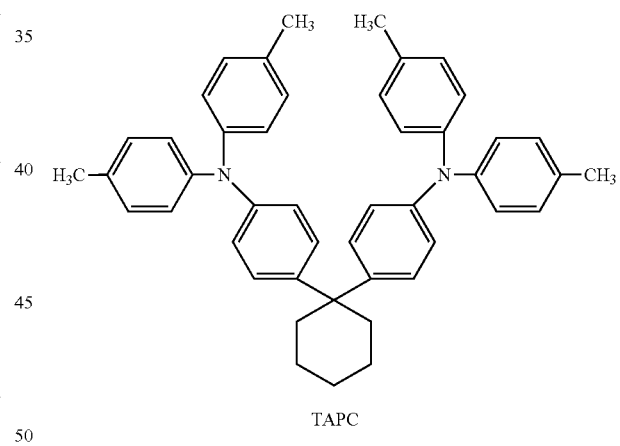

TAPC

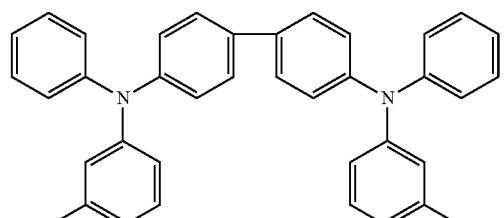

TPD

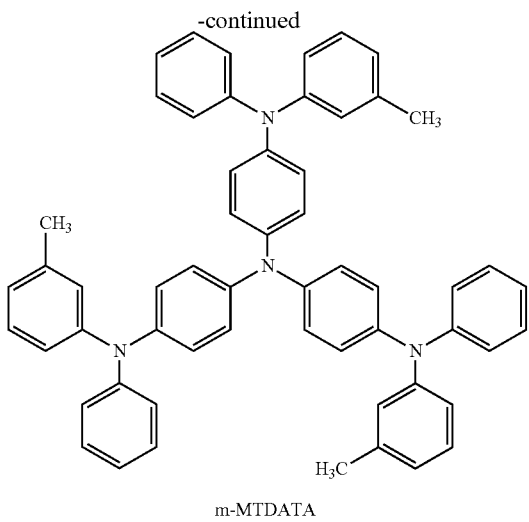

m-MTDATA

Other hole transporting materials may be arylamine materials such as N,N'-diphenyl-N,N'-bis-[4-(phenyl-m-tolyl-amino)-phenyl]-biphenyl-4,4'-diamine (DNTPD), N,N'-di(1-naphthyl)-N,N'-diphenyl benzidine (NPB), 4,4',4''-tris(N,N-diphenylamino)triphenylamine (TDATA), dipyrazino[2,3-f:2',3'-h]quinoxaline-2,3,6,7,10,11-hexacarbonitrile (HAT-CN), 9,9',9''-triphenyl-9H,9'H,9''H-3,3':6',3''-tercarbazole (Tris-PCz), 4,4',4''-tri(9-carbazoyl)triphenylamine (TCTA), 2,2',7,7'-tetrakis (N,N-diphenylamino)-2,7-diamino-9,9'-spirobifluorene (Spiro-TAD), 2,2',7,7'-tetrakis (N,N-di-p-methoxyphenylamino)-9,9'-spirobifluorene (Spiro-MeOTAD), 4,4',4''-tris(N,N-2-naphthylphenylamino)triphenylamine (2-TNATA), etc.; polymer semiconductor materials such as polyaniline/dodecylbenzenesulfonic acid (PANI/DBSA), poly(3,4-ethylenedioxythiophene)/poly(4-styrenesulfonate) (PEDOT/PSS), polyaniline camphorsulfonic acid (PANI/CSA), polyaniline/poly(4-styrenesulfonate) (PANI/PSS), etc.; commercial products such as N-(diphenyl 4-yl)-9,9-dimethyl-N-(4-(9-phenyl-9H-carbazoyl-3-yl) phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled) NHT-18 (manufactured by Novaled), NHT-49 (manufactured by Novaled), NHT-51 (manufactured by Novaled), NDP-2 (manufactured by Novaled), NDP-9 (manufactured by Novaled), etc.

As such a material for forming the hole transport layer 13, a commercial product may be used, or a synthetic product may be used. Further, as the material for forming the hole transport layer 13, one type may be used alone, or two or more types may be used in combination.

(Fluorinated Polymer)

The fluorinated polymer contained in the charge injection layer and the charge transport layer of the present invention is a polymer containing fluorine atoms. In this embodiment, an oligomer will also be included in the polymer. That is, the fluorinated polymer may be an oligomer.

The fluorinated polymer preferably has a sufficient evaporation rate or saturated vapor pressure for practical use at a temperature below a level where the thermal decomposition of the fluorinated polymer takes place, from the viewpoint of the rate of formation of a layer such as a hole transport layer, and the strength and surface roughness of the layer. The thermal decomposition initiation temperature of PTFE being a common fluorinated polymer is about 400° C., and the thermal decomposition initiation temperature of Teflon (registered trademark) AF is 350° C. The evaporation rate at 300° C. of the fluorinated polymer according to this embodiment is preferably at least 0.01 g/m² sec., more preferably at least 0.02 g/m² sec. Further, the saturation vapor pressure at 300° C. is preferably at least 0.001 Pa, more preferably at least 0.002 Pa. From this viewpoint, the fluorinated polymer is preferably a perfluoropolymer, of which the intermolecular interaction is considered to be small. Further, a polymer having an aliphatic ring structure in its main chain, of which crystallinity is said to be low, is more preferred. Here, having an aliphatic ring structure in its main chain, means that the fluorinated polymer has an aliphatic ring structure (ring structure which does not exhibit aromaticity) in repeating units, and at least one of carbon atoms constituting the aliphatic ring constitutes the main chain.

In this specification, the saturated vapor pressure (unit: Pa) is a value measured by a vacuum differential thermal balance (manufactured by ADVANCE RIKO, Inc.: VPE-9000).

The weight average molecular weight (hereinafter represented by "Mw") of the fluorinated polymer is preferably from 1,500 to 50,000, more preferably from 3,000 to 40,000, further preferably from 5,000 to 30,000. When the weight average molecular weight is at least 1,500, sufficient strength is likely to be readily obtainable in the case of forming a layer by the fluorinated polymer. On the other hand, when the weight average molecular weight is at most 50,000, the fluorinated polymer has a saturated vapor pressure which presents a practical layer forming rate (deposition rate), whereby it will be unnecessary to heat the deposition source to a high temperature, specifically to a temperature exceeding 400° C. If the temperature of the deposition source is too high, the main chain of the fluorinated polymer is likely to be cleaved in the vapor deposition process, whereby the fluorinated polymer ends up to have a low molecular weight, and the strength of the layer to be formed tends to be insufficient, and further, defects derived from decomposed products will be formed, whereby it will be difficult to obtain a smooth surface. Moreover, such a possibility that molecules or ions formed by cleavage of the main chain and unintentionally included, may affect the electrical conductivity of the film or the light emission lifetime of the organic EL element, is assumed.

Therefore, when Mw is within the range of from 1,500 to 50,000, it is possible to form a layer having a sufficient strength and smooth surface without causing cleavage of the main chain of the fluorinated polymer.

The "polydispersity" is meant for the proportion of Mw to the number average molecular weight (hereinafter represented by "Mn"), i.e. Mw/Mn. From the viewpoint of the stability of quality in the layer to be formed, the polydispersity (molecular weight distribution) (Mw/Mn) of the fluorinated polymer should better be small, preferably at most 2. Here, the theoretical lower limit of the polydispersity is 1. As a method for obtaining a fluorinated polymer having a small polydispersity, a method of carrying out controlled polymerization such as living radical polymerization, a molecular weight fractionation purification method using size exclusion chromatography, or a molecular weight fractionation purification method by sublimation purification, may be mentioned. Among these methods, in consideration of the stability of the deposition rate when applying a deposition method for formation of the layer, it is preferred to carry out the sublimation purification.

In this specification, Mw and Mn are values measured by gel permeation chromatography (GPC).

The glass transition temperature (Tg) of the fluorinated polymer should better be high, since the reliability of the obtainable element becomes high. Specifically the glass transition temperature is preferably at least 60° C., more preferably at least 80° C., particularly preferably at least 100° C. The upper limit is not particularly limited, but is preferably 350° C., more preferably 300° C.

In a case where the perfluoropolymer having a fluorinated aliphatic ring structure in its main chain, is a perfluoropolymer (referred to also as a poly perfluoro(3-butenyl vinyl ether)) consisting solely of repeating units formed by cyclopolymerization of perfluoro(3-butenyl vinyl ether), the intrinsic viscosity [η] is preferably from 0.01 to 0.14 dl/g, more preferably from 0.02 to 0.1 dl/g, particularly preferably from 0.02 to 0.08 dl/g. When [η] is at least 0.01 dl/g, the molecular weight of the fluorinated polymer becomes to be relatively large, whereby it tends to be easy to obtain sufficient strength in the layer after formation. On the other hand, when [η] is at most 0.14 dl/g, the molecular weight of the fluorinated polymer becomes to be relatively small, whereby it will have a saturated vapor pressure which gives a practical deposition rate.

In this specification, the intrinsic viscosity [η] (unit: dl/g) is a value measured by the Ubbelohde viscometer (manufactured by Shibata Scientific Technology Ltd.: viscometer Ubbelohde) at a measurement temperature of 30° C. by using ASAHIKLIN (registered trademark) AC2000 (manufactured by Asahi Glass Company, Limited) as the solvent.

The upper limit value of the refractive index at a wavelength of from 450 nm to 800 nm of the fluorinated polymer is preferably 1.5, more preferably 1.4. When the refractive index is at most 1.5, it is possible to lower the refractive index of a layer such as a charge injection layer or charge transport layer obtainable by mixing with an organic semiconductor material, to a level of 1.55 i.e. equivalent to the refractive index of e.g. a glass substrate, such being preferred since the light extraction efficiency will be improved. On the other hand, the theoretical lower limit value for the refractive index is 1.0.

The refractive index of the organic semiconductor material is generally at a level of from 1.7 to 1.8. To such a common organic semiconductor material, by mixing a fluorinated polymer having a refractive index of at most 1.5, it is possible to reduce the refractive index of the obtainable charge injection layer, charge transport layer or the like. When the refractive index of the charge injection layer or charge transport layer is lowered to be close to the refractive index of an electrode, glass substrate or the like (the refractive indexes of soda glass and quartz glass are, respectively, from about 1.51 to 1.53, and from about 1.46 to 1.47, in the visible light region) adjacent to the charge injection layer or charge transport layer, it is possible to avoid the total reflection occurring at the interface between the charge injection layer or charge transport layer, and the electrode or glass substrate, whereby light extraction efficiency will be improved.

As the fluorinated polymer, the following polymers (1) and (2) may be mentioned.

Polymer (1): A fluorinated polymer having no aliphatic ring and having units (hereinafter referred to also as "fluoroolefin units") derived from a fluoroolefin, in the main chain.

Polymer (2): A fluorinated polymer having an aliphatic ring in the main chain.

<<Polymer (1)>>

The polymer (1) may be a homopolymer of a fluoroolefin, or a copolymer of a fluoroolefin and another monomer copolymerizable with the fluoroolefin.

The fluoroolefin may be tetrafluoroethylene, hexafluoropropylene, chlorotrifluoroethylene, vinylidene fluoride, vinyl fluoride, a perfluoroalkyl ethylene (such as one having a $C_{1-10}$ perfluoroalkyl group), a perfluoro(alkyl vinyl ether), trifluoroethylene, etc.

Among the exemplified ones, from such a viewpoint that it is easy to lower the refractive index of the charge injection layer and the charge transport layer, tetrafluoroethylene, hexafluoropropylene or a perfluoro(alkyl vinyl ether) where all of hydrogen atoms bonded to carbon atoms are substituted by fluorine, is preferred.

As another monomer copolymerizable with the fluoroolefin, a vinyl ether, a vinyl ester, an aromatic vinyl compound, an allyl compound, an acryloyl compound, a methacryloyl compound, or the like, may be mentioned.

In a case where the polymer (1) is a copolymer, the proportion of units derived from a fluoroolefin is preferably at least 20 mol %, more preferably at least 40 mol %, further preferably at least 80 mol %.

A functional group at a terminal of the main chain of the polymer (1) is preferably a less reactive functional group. The less reactive functional group may, for example, be an alkoxycarbonyl group, a trifluoromethyl group or the like.

As the polymer (1), a synthesized one may be used, or a commercially available product may be used.

The polymer (1) includes the following fluorinated polymers.

Polytetrafluoroethylene (PTFE), a tetrafluoroethylene-perfluoro(alkyl vinyl ether) copolymer (manufactured by Asahi Glass Company, Limited: Fluon (registered trademark) PFA), a tetrafluoroethylene/hexafluoropropylene copolymer (FEP), a tetrafluoroethylene/perfluoro(alkyl vinyl ether)/hexafluoropropylene copolymer (EPA), an ethylene-tetrafluoroethylene copolymer (manufactured by Asahi Glass Company, Limited: Fluon (registered trademark) ETFE), polyvinylidene fluoride (PVdF), polyvinyl fluoride (PVF), polychlorotrifluoroethylene (PCTFE), an ethylene/chlorotrifluoroethylene copolymer (ECTFE), etc.

Among the exemplified ones, from such a viewpoint that it is easy to lower the refractive indexes of the charge injection layer and the charge transport layer, polytetrafluoroethylene (PTFE), a tetrafluoroethylene/perfluoro(alkyl vinyl ether) copolymer (PFA), a tetrafluoroethylene/hexafluoropropylene copolymer (FEP), and a tetrafluoroethylene/perfluoro(alkyl vinyl ether)-hexafluoropropylene copolymer (EPA) where all hydrogen atoms or chlorine atoms bonded to carbon atoms are substituted by fluorine, are preferred.

The polymer (1) can be produced by using a known method.

As the polymer (1), a synthesized one may be used, or a commercially available product may be used.

<<Polymer (2)>>

The polymer (2) is a fluorinated polymer having an aliphatic ring in the main chain.

The "fluorinated polymer having an aliphatic ring structure in the main chain" means that the fluorinated polymer has units having an aliphatic ring structure, and at least one of carbon atoms constituting the aliphatic ring is the carbon atom constituting the main chain. The aliphatic ring may be a ring having a hetero atom such as an oxygen atom.

The "main chain" of a polymer is meant for a chain of carbon atoms derived from two carbon atoms constituting a polymerizable double bond in a polymer of a monoene having a polymerizable double bond, or a chain of carbon atoms derived from four carbon atoms constituting two polymerizable double bonds in a cyclized polymer of a cyclopolymerizable diene. In a copolymer of a monoene and a cyclopolymerizable diene, the main chain is composed of the above two carbon atoms of the monoene and the above four carbon atoms of the diene.

Therefore, in the case of a polymer of a monoene having an aliphatic ring, it is a polymer of a monoene having such a structure that one carbon atom constituting the ring skeleton of the aliphatic ring, or adjacent two carbon atoms constituting the ring skeleton, are carbon atoms to constitute a polymerizable double bond. In the case of a cyclized polymer of a cyclopolymerizable diene, as described below, from 2 to 4 among four carbon atoms constituting the two double bonds, become carbon atoms constituting the aliphatic ring.

The number of atoms constituting the ring skeleton of the aliphatic ring in the polymer (2) is preferably from 4 to 7, particularly preferably from 5 to 6. That is, the aliphatic ring is preferably a 4 to 7-membered ring, particularly preferably a 5 to 6-membered ring. In a case where a hetero atom is present as an atom constituting the ring of an aliphatic ring, as such a hetero atom, an oxygen atom, a nitrogen atom or the like may be mentioned, and an oxygen atom is preferred. Further, the number of hetero atoms constituting the ring is preferably from 1 to 3, more preferably 1 or 2. The aliphatic ring may have a substituent or may not have a substituent. "May have a substituent" means that a substituent may be bonded to an atom constituting the ring skeleton of the aliphatic ring.

Hydrogen atoms bonded to carbon atoms constituting the aliphatic ring of the polymer (2) are preferably substituted by fluorine atoms. Further, also in a case where the aliphatic ring has a substituent and has hydrogen atoms bonded to carbon atoms in the substituent, the hydrogen atoms are preferably substituted by fluorine atoms. As a substituent having fluorine atoms, a perfluoroalkyl group, a perfluoroalkoxy group, =CF$_2$, etc. may be mentioned.

As the aliphatic ring in the polymer (2), from such a viewpoint that it is easy to lower the refractive index of the charge injection layer and the charge transport layer, a perfluoroaliphatic ring (an aliphatic ring in which all of hydrogen atoms bonded to carbon atoms, including a substituent, are substituted by fluorine atoms) is preferred.

The polymer (2) includes the following polymers (21) and (22).

Polymer (21): A fluorinated polymer having units derived from a fluorinated cyclic monoene.

Polymer (22): A fluorinated polymer having units formed by cyclopolymerization of a cyclopolymerizable fluorinated diene (hereinafter simply referred to also as a "fluorinated diene").

Fluoropolymer (21):

The "fluorinated cyclic monoene" is a fluorinated monomer having one polymerizable double bond between carbon atoms constituting an aliphatic ring, or a fluorinated monomer having one polymerizable double bond between a carbon atom constituting an aliphatic ring and a carbon atom outside of the aliphatic ring.

As the fluorinated cyclic monoene, the following compound (1) or compound (2) is preferred.

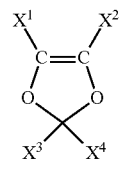

(1)

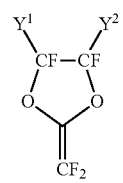

(2)

[wherein $X^1$, $X^2$, $X^3$, $X^4$, $Y^1$ and $Y^2$ are each independently a fluorine atom, a perfluoroalkyl group which may contain an etheric oxygen atom (—O—), or a perfluoroalkoxy group which may contain an etheric oxygen atom; and $X^3$ and $X^4$ may be bonded to each other to form a ring.]

In a perfluoroalkyl group for $X^1$, $X^2$, $X^3$, $X^4$, $Y^1$ and $Y^2$, the number of carbon atoms is preferably from 1 to 7, particularly preferably from 1 to 4. The perfluoroalkyl group is preferably a linear or branched chain, and a linear chain is particularly preferred. Specifically, a trifluoromethyl group, a pentafluoroethyl group, a heptafluoropropyl group, etc. may be mentioned, and a trifluoromethyl group is particularly preferred.

As the perfluoroalkoxy group for $X^1$, $X^2$, $X^3$, $X^4$, $Y^1$ and $Y^2$, one having an oxygen atom (—O—) added to the above perfluoroalkyl group may be mentioned, and a trifluoromethoxy group is particularly preferred.

In the formula (1), $X^1$ is preferably a fluorine atom.

$X^2$ is preferably a fluorine atom, a trifluoromethyl group or a $C_{1-4}$ perfluoroalkoxy group, particularly preferably a fluorine atom or a trifluoromethoxy group.

$X^3$ and $X^4$ are each independently preferably a fluorine atom or a $C_{1-4}$ perfluoroalkyl group, particularly preferably a fluorine atom or a trifluoromethyl group.

$X^3$ and $X^4$ may be bonded to each other to form a ring. The number of atoms constituting the ring skeleton of the ring is preferably from 4 to 7, particularly preferably from 5 to 6.

As preferred examples of the compound (1), compounds (1-1) to (1-5) may be mentioned.

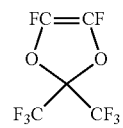

(1-1)

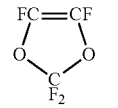

(1-2)

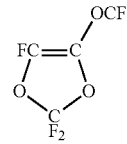

(1-3)

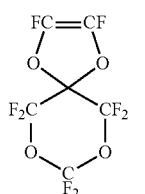

(1-4)

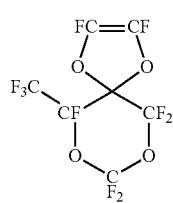

(1-5)

In the formula (2), $Y^1$ and $Y^2$ are each independently preferably a fluorine atom, a $C_{1-4}$ perfluoroalkyl group or a $C_{1-4}$ perfluoroalkoxy group, particularly preferably a fluorine atom or a trifluoromethyl group.

As preferred examples of the compound (2), compounds (2-1) and (2-2) may be mentioned.

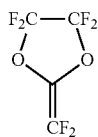

(2-1)

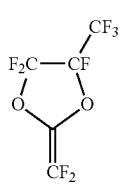

(2-2)

The polymer (21) may be a homopolymer of the above fluorinated cyclic monoene, or a copolymer of the fluorinated cyclic monoene and another copolymerizable monomer.

However, the proportion of units derived from the fluorinated cyclic monoene to all units in the polymer (21) is preferably at least 20 mol %, more preferably at least 40 mol %, further preferably 100 mol %.

As another monomer copolymerizable with the fluorinated cyclic monoene, for example, a fluorinated diene, a monomer having a reactive functional group in the side chain, tetrafluoroethylene, chlorotrifluoroethylene, perfluoro(methyl vinyl ether), etc. may be mentioned.

The fluorinated diene may be the same one as mentioned below in the description of the polymer (22). The monomer having a reactive functional group in the side chain may be a monomer having a polymerizable double bond and a reactive functional group. The polymerizable double bond may be $CF_2=CF-$, $CF_2=CH-$, $CH_2=CF-$, $CFH=CF-$, $CFH=CH-$, $CF_2=C$, $CF=CF-$, etc. The reactive functional group may be the same one as mentioned below in the description of the polymer (22).

A polymer obtainable by copolymerization of a fluorinated cyclic monoene and a fluorinated diene is a polymer (21).

Polymer (22):

The "fluorinated diene" is a cyclopolymerizable fluorinated monomer having two polymerizable double bonds and fluorine atoms. The polymerizable double bond is preferably a vinyl group, an allyl group, an acryloyl group, or a methacryloyl group. The fluorinated diene is preferably the following compound (3).

$$CF_2=CF-Q-CF=CF_2 \qquad (3).$$

In the formula (3), Q is a $C_{1-5}$, preferably $C_{1-3}$, perfluoroalkylene group which may have a branch and which may contain an etheric oxygen atom, wherein some of fluorine atoms may be substituted by halogen atoms other than fluorine atoms. The halogen atoms other than fluorine atoms may be chlorine atoms, bromine atoms, etc.

Q is preferably a perfluoroalkylene group containing an etheric oxygen atom. In that case, the etheric oxygen atom in the perfluoroalkylene group may be present at one terminal of the perfluoroalkylene group, may be present at both terminals of the perfluoroalkylene group, or may be present between carbon atoms in the perfluoroalkylene group. From the viewpoint of cyclopolymerization, it is preferred that the etheric oxygen atom is present at one terminal of the perfluoroalkylene group.

Specific examples of the compound (3) include the following compounds.

$CF_2=CFOCF_2CF=CF_2$,
$CF_2=CFOCF(CF_3)CF=CF_2$,
$CF_2=CFOCF_2CF_2CF=CF_2$,
$CF_2=CFOCF_2CF(CF_3)CF=CF_2$,
$CF_2=CFOCF(CF_3)CF_2CF=CF_2$,
$CF_2=CFOCFClCF_2CF=CF_2$,
$CF_2=CFOCCl_2CF_2CF=CF_2$,
$CF_2=CFOCF_2OCF=CF_2$,
$CF_2=CFOC(CF_3)_2OCF=CF_2$,
$CF_2=CFOCF_2CF(OCF_3)CF=CF_2$,
$CF_2=CFCF_2CF=CF_2$,
$CF_2=CFCF_2CF_2CF=CF_2$,
$CF_2=CFCF_2OCF_2CF=CF_2$.

Units to be formed by cyclopolymerization of the compound (3) include the following units (3-1) to (3-4).

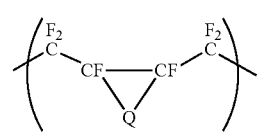

(3-1)

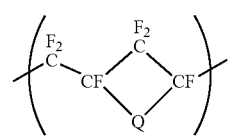

(3-2)

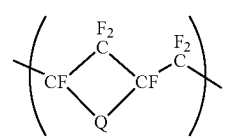

(3-3)

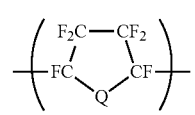

(3-4)

The polymer (22) may be a homopolymer of a fluorinated diene, or a copolymer of a fluorinated diene and another copolymerizable monomer.

As another monomer copolymerizable with the fluorinated diene, for example, a monomer having a reactive functional group in the side chain, tetrafluoroethylene, chlorotrifluoroethylene, perfluoro(methyl vinyl ether), etc. may be mentioned.

A specific example of the polymer (22) may, for example, be a polymer represented by the following formula (3-1-1) obtainable by cyclopolymerizing $CF_2=CFOCF_2CF_2CF=CF_2$ (perfluoro(3-butenyl vinyl ether)).

In the following, the perfluoro(3-butenyl vinyl ether) will be referred to as "BVE".

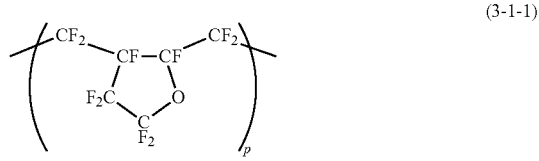

(3-1-1)

Here, in the formula (3-1-1), p is an integer of from 5 to 1,000.

p is preferably an integer of from 10 to 800, particularly preferably an integer of from 10 to 500.

The functional group at a terminal of the main chain of the polymer (2) is preferably a less reactive functional group. The less reactive functional group may, for example, be an alkoxycarbonyl group, a trifluoromethyl group or the like.

As the polymer (2), a synthesized one may be used, or a commercially available product may be used.

As specific examples of the polymer (2), a BVE cyclized polymer (manufactured by Asahi Glass Company, Limited: CYTOP (registered trademark)), a tetrafluoroethylene/perfluoro(4-methoxy-1,3-dioxole) copolymer (manufactured by Solvay: Hyflon (registered trademark) AD), a tetrafluoroethylene/perfluoro(2,2-dimethyl-1,3-dioxole) copolymer (manufactured by DuPont: Teflon (registered trademark) AF), and a perfluoro(4-methyl-2-methylene-1,3-dioxolane) polymer (MMD polymer) are preferred.

In the present invention, the fluorinated polymer is preferably the polymer (2), more preferably the polymer (22), particularly preferably a fluorinated polymer represented by the formula (3-1-1) obtainable by cyclopolymerizing BVE.

The material for forming the hole transport layer 13 may contain a dopant to facilitate the transfer of charge to and from the above described fluorinated polymer and organic semiconductor material. As the organic semiconductor material, one type may be used alone, or two or more types may be used in combination, and also as the fluorinated polymer, one type may be used alone, or two or more types may be used in combination.

In the material for forming the hole transport layer 13, the volume ratio of the content (A) of the fluorinated polymer to the content (B) of the organic semiconductor material is preferably (A):(B)=from 70:30 to 5:95, more preferably from 60:40 to 20:80. When the volume ratio of the fluorinated polymer to the organic semiconductor material is within the above range, the refractive index of the hole transport layer 13 to be obtained will be lowered to a level equal to the refractive index of a glass substrate or the like, whereby the light extraction efficiency of the organic EL element will be improved, such being preferred.

Such a hole-transport layer 13 may be formed by a known dry coating method or a wet coating method.

In a case where the organic semiconductor material to be used is a polymeric material, for the formation of the hole transport layer 13, it is preferred to adopt a known wet coating method. As the wet coating method, an inkjet method, a cast coating method, a dip coating method, a bar coating method, a blade coating method, a roll coating method, a gravure coating method, a flexo coating method, a spray coating method, etc. may be mentioned. In the case of adopting a wet coating method, a solution or dispersion in which the organic semiconductor material and the fluorinated polymer to be used, are mixed in a desired ratio, may be prepared and film-deposited by any one of the above-mentioned methods.

In a case where the organic semiconductor material to be used is a low molecular material, for the formation of the hole transport layer 13, it is preferred to adopt a known dry coating method. The dry coating is preferred because it is thereby easy to film-deposit the fluorinated polymer and the organic semiconductor material in a uniform mixing ratio.

As the dry coating method, a physical vapor deposition method such as a resistance heating vapor deposition method, an electron beam vapor deposition method or a sputtering method, may be mentioned. A hole transport layer 13 to be formed by a physical vapor deposition method is a physical vapor deposition layer. In a case where the material for forming the hole transport layer 13 is a low molecular material, a probability such that the hole transport layer 13 will be a physical vapor deposition layer, is high. Among them, since film-formation will be easy without decomposing of the organic semiconductor and the fluorinated polymer, a resistance heating vapor deposition method is preferred, and particularly preferred is a co-vapor deposition method by resistance heating, which comprises a step of co-vapor depositing a fluorinated polymer and an organic semiconductor material.

The vapor deposition rate in co-vapor deposition (the vapor deposition rate of the total of the fluorinated polymer and the organic semiconductor material) is not particularly limited, but it is preferably from 0.001 to 10 nm/s. At that time, the mixing ratio can be controlled by the vapor deposition speed ratio of the fluorinated polymer and the organic semiconductor material.

The thickness of the hole transport layer 13 is not particularly limited, but it is preferably from 10 nm to 350 nm, more preferably from 20 nm to 300 nm.

Of the hole transport layer 13, the absorption coefficient in the wavelength range of from 450 nm to 800 nm is preferably at most 5,000 $cm^{-1}$, more preferably at most 1,000 $cm^{-1}$, and it is particularly preferred that it has no absorption band in the above wavelength region. Here, "the absorption coefficient (unit: $cm^{-1}$)" is a value measured by using an ultraviolet-visible spectrophotometer (manufactured by Shimadzu Corporation: UV-2450) with respect to the hole transport layer on a quartz substrate.

If the absorption coefficient of each layer constituting the hole transport layer 13 exceeds 5,000 $cm^{-1}$, when light passes once through the hole transport layer having a thickness of 100 nm, 5% of the light will be absorbed when the total amount of the light before passing is assumed to be 100%. Inside of the organic EL element, by multiple interference of light, losses due to absorption of light at the time of passing through the hole transport layer 13 will accumulate. Therefore, the light absorption at the time of passing through the hole transport layer becomes a factor which significantly lowers the light extraction efficiency. It is extremely important to use a hole transport layer having a sufficiently small light absorption in order not to impair the light emission efficiency of the organic electroluminescence element. When the light emission efficiency of the organic EL element is not impaired, energy utilization efficiency becomes high, and the element lifetime becomes longer as a result of suppression of heat generation due to light absorption.

(Dopant)

As specific examples of the dopant for forming the hole transport material, organic dopants such as TCNQ, $F_4$-TCNQ, PPDN, TCNNQ, $F_6$-TCNNQ, HAT-CN, HATNA, HATNA-$Cl_6$, HATNA-$F_6$, $C_{60}F_{36}$, $F_{16}$—CuPc, NDP-2 (manufactured by Novaled), NDP-9 (manufactured by Novaled), etc., or inorganic dopants such as $MoO_3$, $V_2O_5$, $WO_3$, $ReO_3$, CuI, etc. may be mentioned.

(Electron Blocking Layer)

The electron blocking layer 19 is sandwiched between the hole transport layer 13 and the light emitting layer 14 and is formed in contact with the hole transport layer 13 and the light emitting layer 14. The energy level of the lowest unoccupied orbital (LUMO) of the material for forming the electron blocking layer 19 is higher than the energy level of LUMO of the material for forming the hole transport layer 13. The energy level being high, means being closer to the vacuum level, and the energy level being low, means being far from the vacuum level.

Further, the LUMO energy level of the material for forming the electron blocking layer 19 is higher than the LUMO energy level of the material for forming the light emitting layer 14. The energy difference between the LUMO energy level of the electron blocking layer 19 and the LUMO energy level of the light emitting layer 14 is preferably larger than 0.3 eV, more preferably larger than 0.5 eV.

The energy difference between the LUMO energy level of the electron blocking layer 19 and the LUMO energy level of the light emitting layer 14, is preferably larger than the energy difference between the LUMO energy level of the hole transport layer 13 and the LUMO energy level of the light emitting layer 14.

As the material for forming the electron blocking layer 19, a known semiconductor material may be used. As such a material, for example, the following semiconductor materials may be mentioned.

Arylamine materials such as N,N'-di-(1-naphthyl)-N,N'-diphenyl benzidine (α-NPD), di-[4-(N,N-ditolyl-amino)-phenyl]cyclohexane (TAPC), $N^1,N^1,N^3,N^3$-tetra-m-tolyl-benzene-1,3-diamine (PDA), N,N'-diphenyl-N,N'-di(m-tolyl)benzidine (TPD), N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), 4,4',4"-tris(N,N-diphenylamino) triphenylamine (TDATA), dipyrazino[2,3-f:2',3'-h]quinoxaline-2,3,6,7,10,11-hexacarbonitrile (HAT-CN), 9,9',9"-triphenyl-9H,9'H,9"H-3,3':6',3"-tercarbazole (Tris-PCz), 4,4',4"-tris (N-(naphthalen-2-yl)-N-phenyl-amino)triphenylamine (2-TNATA), 4,4',4"-tri(9-carbazoyl) triphenylamine (TCTA), 2,2',7,7'-tetrakis(N,N-diphenylamino)-2,7-di-amino-9,9'-spirobifluorene (spiro-TAD), 2,2',7,7'-tetrakis(N,N-di-p-methoxyphenylamino)-9,9'-spirobifluorene (spiro-MeOTAD), etc.;

polymer semiconductor materials such as polyaniline/dodecylbenzenesulfonic acid (PANI/DBSA), poly(3,4-ethylenedioxythiophene)/poly(4-styrenesulfonate) (PEDOT/PSS), polyaniline camphorsulfonic acid (PANI/CSA), polyaniline/poly (4-styrenesulfonate) (PANI/PSS), etc.;

commercial products such as N-(diphenyl-4-yl)-9,9-dimethyl-N-(4-(9-phenyl-9H-carbazoyl-3-yl)phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled), NHT-51 (manufactured by Novaled), NDP-2 (manufactured by Novaled), NDP-9 (manufactured by Novaled), etc.

These compounds may be used as a material for forming the hole transport layer 13. However, as the material for forming the electron blocking layer 19, one different from the organic semiconductor material to be used for the hole transport layer 13, is employed.

The difference between the LUMO energy level of the material for forming the electron blocking layer 19 and the LUMO energy level of the organic semiconductor material to be used for the hole transport layer 13, should better be large. For example, in a case where, as the material for forming the hole transport layer 13, α-NPD (LUMO energy level: 2.40 eV) is used, it is preferred to use, as the material for forming the electron blocking layer 19, Spiro-MeOTAD (LUMO energy level: 1.76 eV) or the like.

The thickness of the electron blocking layer 19 is not particularly limited, but is preferably from 1 nm to 50 nm, more preferably from 5 nm to 30 nm, further preferably from 10 nm to 20 nm.

(Light Emitting Layer)

The light emitting layer 14 is formed in contact with the electron blocking layer 19. In the light emitting layer 14, holes injected from the anode 11 and electrons injected from the cathode 17 are recombined to emit photons thereby to emit light. The light emission wavelength at that time is determined depending on the material for forming the light emitting layer 14.

The LUMO energy level of the material for forming the light emitting layer 14 is lower than the LUMO energy level of the material for forming the hole transport layer 13.

As the material for forming the light emitting layer 14, a known one may be employed such as a fluorescent material, a heat activated delayed fluorescence (TADF) material or a phosphorescent material. For example, as the material for forming the light emitting layer 14, a light emitting dopant material such as (E)-2-(2-(4-(dimethylamino)styryl)-6-methyl-4H-pyran-4-ylidene)malononitrile (DCM), 4-(di-cyanomethylene)-2-methyl-6-julolidyl-9-enyl-4H-pyran ($DCM_2$), Rubrene, Coumarin 6, $Ir(ppy)_3$, $(ppy)_2Ir(acac)$, etc., a phosphorescent host material such as 4,4'-bis(9H-carbazol-9-yl)biphenyl (CBP), 3,3'-di(9H-carbazol-9-yl)-1,1'-biphenyl (mCBP), etc., a fluorescent host material such as ADN, $Alq_3$, etc., a polymer material such as polyphenylene vinylene (PPV), MEH-PPV, etc., may be mentioned, but the material is not limited thereto. As the material for forming the light emitting layer 14, one type may be used alone, or two or more types may be used in combination, and it is suitably selected depending on the desired light emission wavelength. The refractive index of the light emitting layer 14 is from 1.65 to 1.90 in the wavelength range of 450 nm to 800 nm, and, for example, it is from 1.70 to 1.80 at a wavelength of 600 nm.

The thickness of the light emitting layer 14 is not particularly limited, but is preferably from 10 to 50 nm. The thickness of the light emitting layer 14 is, for example, 15 nm.

(Electron Transport Layer)

The electron transport layer 15 is formed in contact with the light emitting layer 14. The electron transport layer 15 has a function to satisfactorily transport electrons injected from the cathode 17 towards the light emitting layer 14. The electron transport layer 15 may not be formed.

As the material for forming the electron transport layer 15, it is possible to adopt a known one. For example, as the material for forming the electron transport layer 15, the following $Alq_3$, PBD, TAZ, BND, OXD-7, or 2,2',2"-(1,3,5-benzenetriyl)-tris(1-phenyl-1-H-benzimidazole) (TPBi) may be mentioned. As other examples, as the material for forming the electron transport layer 15, 2,9-dimethyl-4,7-diphenyl-1,10-phenanthroline (BCP), t-Bu-PBD, and silole derivatives may also be mentioned. The material for forming the electron transport layer 15 is not limited thereto. The electron transport layer 15 may contain a material common to the light emitting layer 14.

where there is no electron transport layer 15, the electron injection layer 16 is provided between the cathode 17 and the light emitting layer 14. The electron injection layer 16 has a function to facilitate injection of electrons from the cathode 17 into the electron transport layer 15 or the light emitting layer 14. As the material for forming the electron injection layer 16, it is possible to use a commonly known one. Specific examples may be an inorganic compound such as LiF, $Cs_2CO_3$ or CsF, and the following $Alq_3$, PBD, TAZ, BND, OXD-7, etc., but the material is not limited thereto.

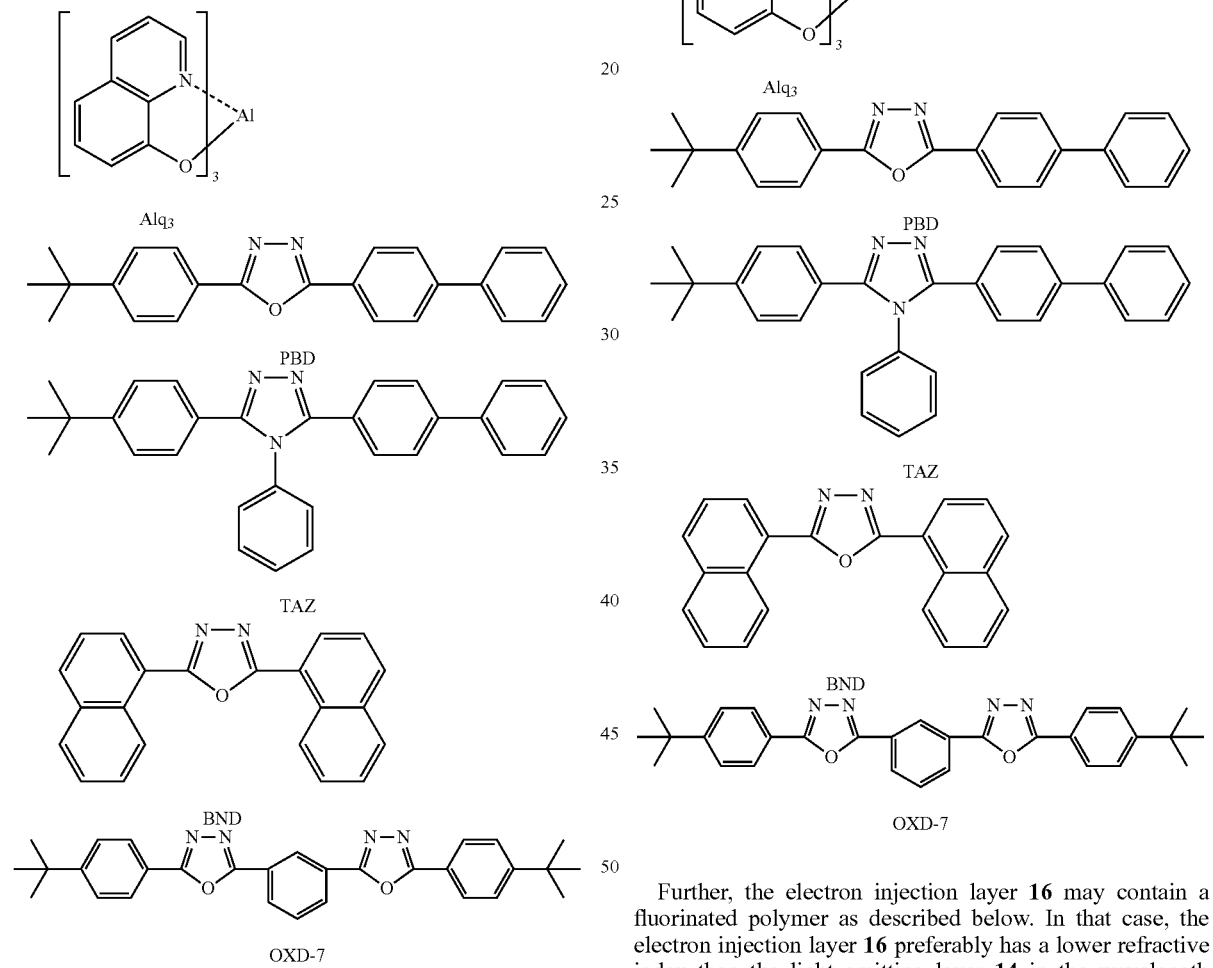

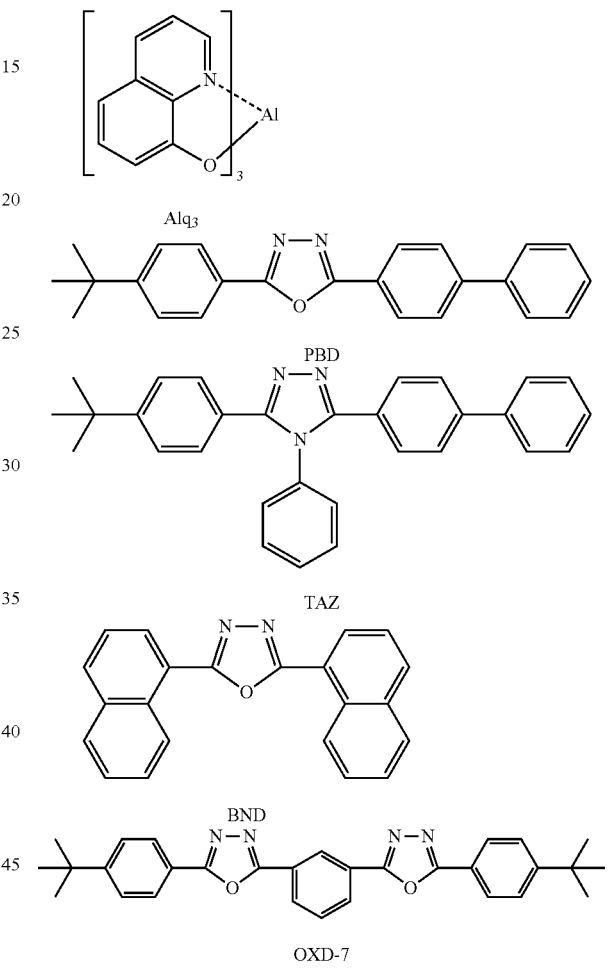

Further, the electron transport layer 15 may contain the above-mentioned fluorinated polymer. In that case, the electron transport layer 15 preferably has a lower refractive index than the light emitting layer 14 in the wavelength range of from 450 to 800 nm.

The thickness of the electron transport layer 15 is not particularly limited, but is preferably from 30 to 200 nm. The thickness of the electron transport layer 15 is, for example, 60 nm.

(Electron Injection Layer)

The electron injection layer 16 is provided between the cathode 17 and the electron transport layer 15. In a case Further, the electron injection layer 16 may contain a fluorinated polymer as described below. In that case, the electron injection layer 16 preferably has a lower refractive index than the light emitting layer 14 in the wavelength range of from 450 to 800 nm.

Further, the electron injection layer 16 may not be formed.

The thickness of the electron injection layer 16 is not particularly limited, but is preferably from 0.5 to 2 nm. The thickness of the electron injection layer 16 is, for example, 1 nm.

(Cathode)

The cathode 17 is formed in contact with the electron injection layer 16. In a case where there is no electron injection layer 16, the cathode 17 is formed in contact with the electron transport layer 15, and in a case where there is no electron injection layer and electron transport layer 15, the cathode 17 is formed in contact with the light emitting layer 14. The cathode 17 has a function to inject electrons into the electron injection layer 16, the electron transport layer 15 or the light emitting layer 14. As the material for forming the cathode 17, it is possible to adopt a known one. For example, as the material for forming the cathode 17, a MgAg electrode or an Al electrode may be mentioned. On the surface of the Al electrode, a buffer layer such as LiF may be formed.

The cathode 17 is a semi-permeable membrane formed to be, as a whole, thin enough to reflect part of light emitted from the light emitting layer 14 and to transmit the rest.

The thickness of the cathode 17 is not particularly limited, but is preferably form 5 to 30 nm. The thickness of the cathode 17 is, for example, 5 nm.

(Microcavity Structure)

In the organic EL device 1 of this embodiment, the anode 11 and the cathode 17 constitute a light resonator structure (microcavity) that resonates light between the anode 11 and the cathode 17. Between the anode 11 and the cathode 17, light generated in the light emitting layer 14 is repeatedly reflected, and light having a wavelength that matches the optical path length between the anode 11 and the cathode 17 is resonated and amplified. On the other hand, light having a wavelength that does not match the optical path length between the anode 11 and the cathode 17 is attenuated.

Here, the "optical path length" shall be calculated by using the desired wavelength of light emitted to the outside of the element and the refractive index of each layer in the wavelength of the desired light.

The optical path length between the anode 11 and the cathode 17 is, for example, set to be an integral multiple of the center wavelength of the light L generated by the light emitting layer 14. In that case, the light L emitted by the light emitting layer 14 will be emitted to the outside of the organic EL element 1 as amplified as it is closer to the center wavelength, or as attenuated as it departs from the center wavelength. In this way, the light L emitted from the organic EL element 1, becomes to be one, of which the half value width of the light emission spectrum is narrow, and the color purity is improved.

The microcavity structure utilizes resonance by fixed end reflections at both ends being the cathode and the anode. Therefore, in a case where "the optical path length from the light emission position to the anode, is an integral multiple of ¼ of the wavelength λ of the desired light emitted to the outside of the element" and "the optical path length from the light emission position to the cathode, is an integral multiple of ¼ of the wavelength λ of the desired light emitted to the outside of the element", it is possible to form the desired micro-cavity structure.

(Function of Electron Blocking Layer)

Figure 2:
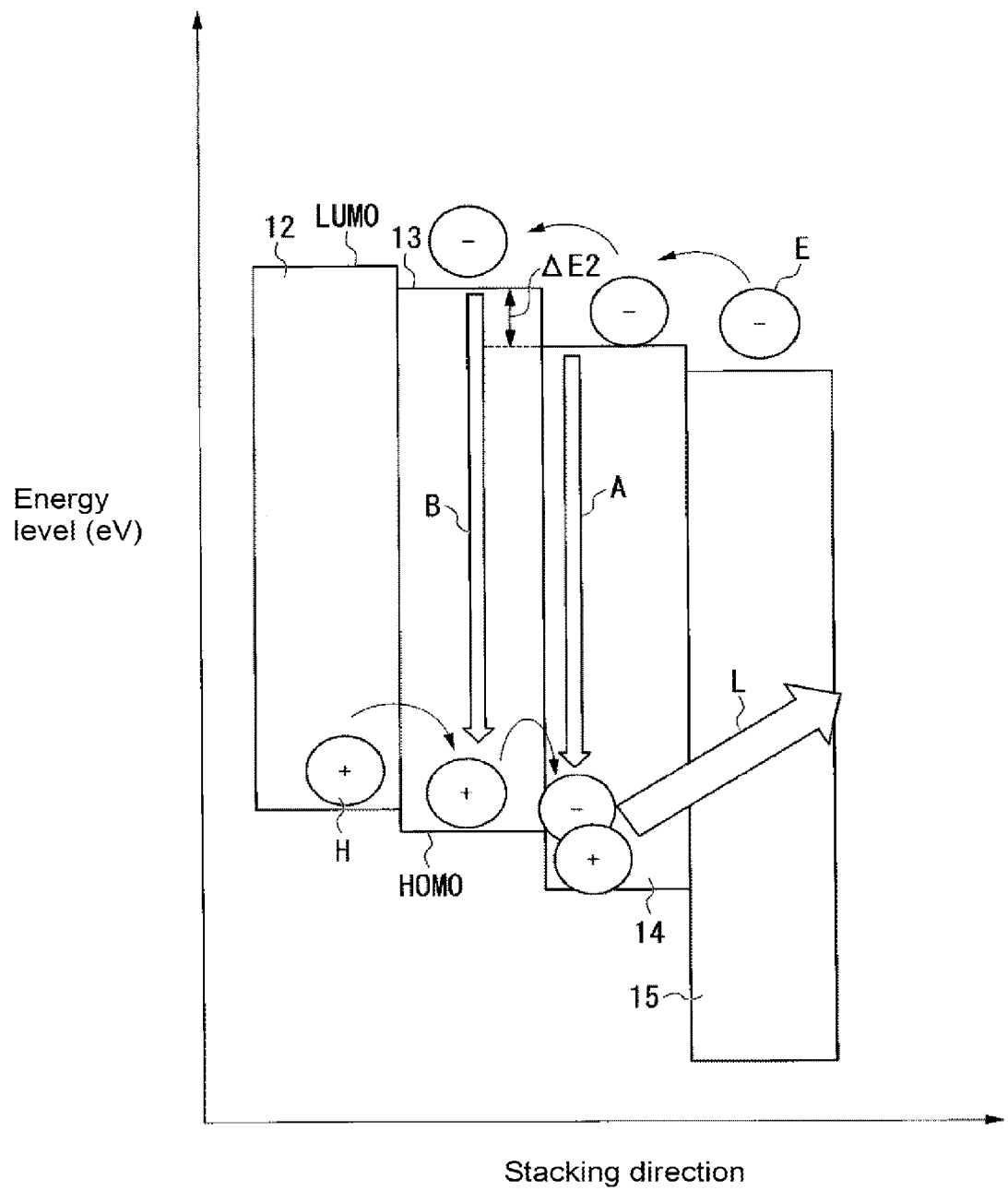
FIG. 2 is a diagram showing the energy band in the case of excluding the electron blocking layer 19 from the organic EL element 1.
Figure 3:
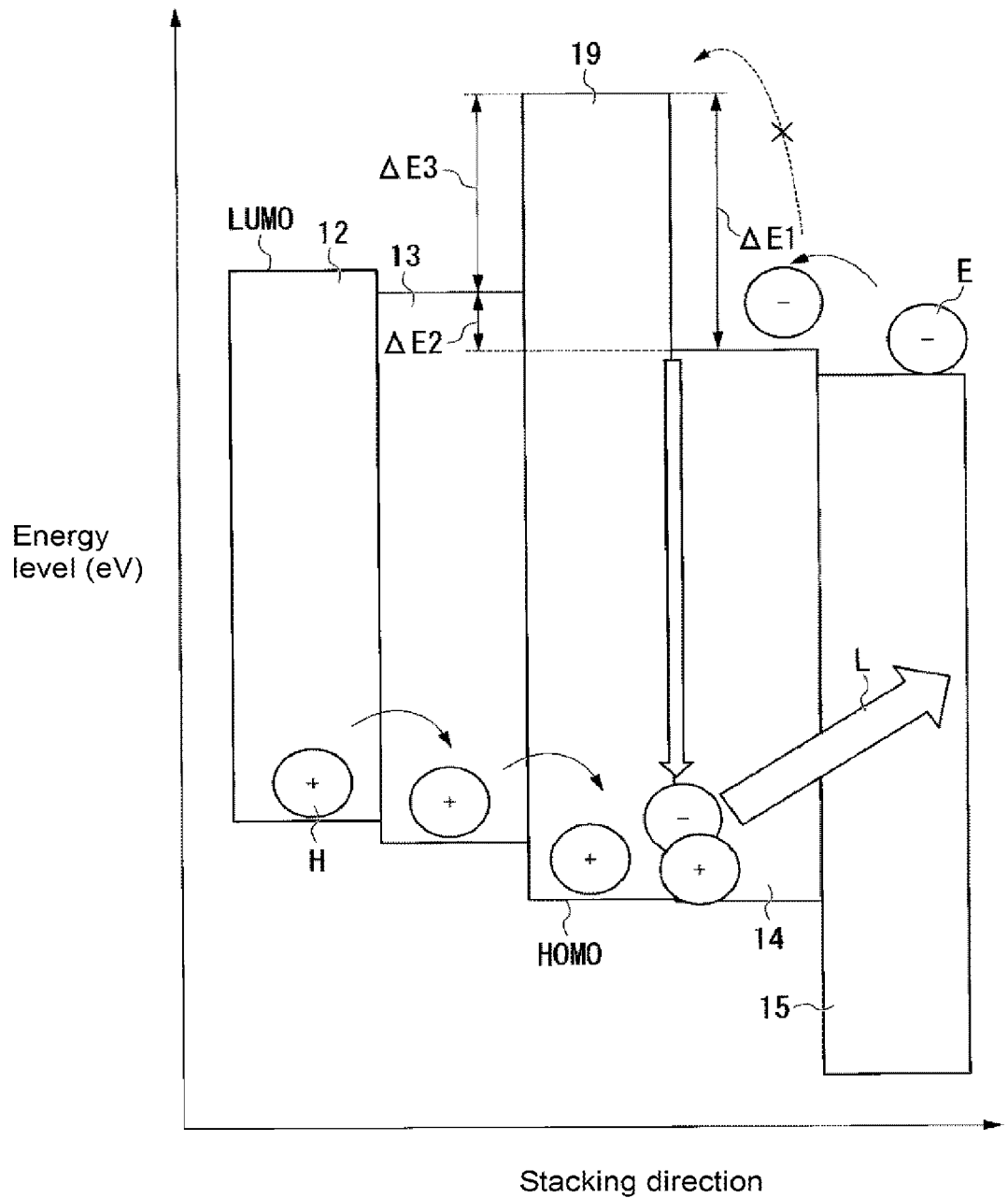
FIG. 3 is a diagram showing the energy band of the organic EL element 1.

FIGS. 2 and 3 are illustrative views for illustrating the function of the electron blocking layer 19. FIG. 2 is a diagram showing the energy band in the case of excluding the electron blocking layer 19 from the above-described organic EL element, and FIG. 3 is a diagram showing the energy band of the organic EL element 1.

In FIGS. 2 and 3, the vertical axis represents the energy level (unit: eV), and the abscissa represents the stacking direction of the respective layers. In FIGS. 2 and 3, the difference in the LUMO energy level between the electronic block layer 19 and the light emitting layer 14 is represented by ΔE1; the difference in the LUMO energy level between the hole transport layer 13 and the light emitting layer 14 is represented by ΔE2; and the difference in the LUMO energy level between the electron blocking layer 19 and the hole transport layer 13 is represented by ΔE3. As shown, ΔE1>ΔE2.

In a case where the energy levels of the respective layers are in such a relationship, as compared with the construction having no electron blocking layer 19, the following effects can be obtained.

First, in a case where there is no electron blocking layer 19 as shown in FIG. 2, if electrons E injected from the cathode acquire an energy exceeding ΔE2 being the energy barrier between the light emitting layer 14 and the hole transport layer 13, they may flow to the transport layer 13. In that case, in addition to recombination of holes H and electrons E in the light emitting layer 14 as shown by A, recombination in the hole transport layer 13 may also occur as shown by B.

In contrast, in a case where there is an electron blocking layer 19 as shown in FIG. 3, electrons injected from the cathode will not flow to the electron blocking layer 19 and the hole transport layer 13, unless it acquires ΔE1 being the energy barrier between the light emitting layer 14 and the electron blocking layer 19 which is larger than ΔE2. Therefore, electrons E supplied from the cathode will be in a form dammed at the interface between the light emitting layer 14 and the electron blocking layer 19, whereby it is possible to increase the probability of occurrence of recombination of holes H and electrons E in the light emitting layer 14.

Accordingly, in the organic EL element 1 having the electron blocking layer 19, it is possible to suppress leakage of electrons to the hole transport layer 13, and thus to prevent the light emission characteristics and long-term reliability of the organic EL element 1 from lowering.

<Verification of Effects by Optical Calculation>

In order to verify such an effect that light extraction efficiency is improved when the hole transport layer 13 becomes to have a low refractive index as it contains a fluorinated polymer, the results obtained by simulation using Setfos4.6 (manufactured by Cybernet Systems Co., Ltd.) will be described. The construction of an element as an object to be analyzed as an example of the organic EL element 1, was such that the substrate 10 was a glass (thickness 1 mm), the anode 11 was Ag (thickness 100 nm), the hole injection layer 12 was HAT-CN (thickness 10 nm), the electron blocking layer 19 was spiro-MeOTAD (thickness 5 nm, 10 nm, 15 nm, 20 nm, 30 nm, 50 nm), the light emitting layer 14 was composed of Ir (ppy) as a light emitting guest and CBP (thickness 20 nm) as a light emitting host, the electron transport layer 15 was Alq$_3$ (thickness 140 nm), the electron injection layer 16 was LiF (thickness 0.8 nm), and the cathode 17 was Al (thickness 10 nm). With respect to the hole transport layer 13, a construction in which a Low-n-HTL layer (refractive index at a wavelength of 550 nm is 1.55) being a low refractive index hole transport layer was used as the hole transport layer, was adopted in Examples 1 to 12, and a construction in which an α-NPD layer (refractive index at a wavelength of 550 nm is 1.77) was used as the hole transport layer, was adopted in Comparative Examples 1 to 12. With respect to the light emitting layer, the light emitting point in the light emitting layer was set to be an intermediate (the light emitting point 0.5) of the light emitting layer; and by sweeping the thickness of the electron transport layer 15 at 30 nm intervals in the range of from 50 nm to 250 nm, and the thickness of the hole transport layer 13 at 30 nm intervals in the range of from 10 nm to 300 nm, the conditions under which light extraction efficiency becomes to be maximum at the thin film side (primary resonance) and thick film side (secondary resonance) of the hole transport layer 13, were calculated. The results of the analysis are shown in Table 1 and FIGS. 5 and 6.

or a polycarbonate resin. Further, it is also possible to use a composite material formed by laminating or mixing the above materials so long as it has optical transparency.

TABLE 1

| First embodiment Top emission | Electron transport layer Thickness nm | Light emitting layer Light emitting point | Thickness nm | Electron blocking layer Material | Thickness nm | Hole transport layer Material | Thickness nm | Light extraction efficiency (maximum value) |
|---|---|---|---|---|---|---|---|---|
| Ex. 1 | 140 | 0.5 | 20 | Spiro-MeOTAD | 5 | Low-n-HTL | 40 | 25.5% |
| Ex. 2 | 140 | 0.5 | 20 | Spiro-MeOTAD | 5 | Low-n-HTL | 220 | 25.0% |
| Ex. 3 | 140 | 0.5 | 20 | Spiro-MeOTAD | 10 | Low-n-HTL | 40 | 25.1% |
| Ex. 4 | 140 | 0.5 | 20 | Spiro-MeOTAD | 10 | Low-n-HTL | 220 | 24.0% |
| Ex. 5 | 140 | 0.5 | 20 | Spiro-MeOTAD | 15 | Low-n-HTL | 40 | 24.5% |
| Ex. 6 | 140 | 0.5 | 20 | Spiro-MeOTAD | 15 | Low-n-HTL | 220 | 23.4% |
| Ex. 7 | 140 | 0.5 | 20 | Spiro-MeOTAD | 20 | Low-n-HTL | 40 | 23.7% |
| Ex. 8 | 140 | 0.5 | 20 | Spiro-MeOTAD | 20 | Low-n-HTL | 220 | 22.7% |
| Ex. 9 | 140 | 0.5 | 20 | Spiro-MeOTAD | 30 | Low-n-HTL | 40 | 21.4% |
| Ex. 10 | 140 | 0.5 | 20 | Spiro-MeOTAD | 30 | Low-n-HTL | 190 | 21.3% |
| Ex. 11 | 140 | 0.5 | 20 | Spiro-MeOTAD | 50 | Low-n-HTL | 10 | 21.0% |
| Ex. 12 | 140 | 0.5 | 20 | Spiro-MeOTAD | 50 | Low-n-HTL | 190 | 20.4% |
| Comp. Ex. 1 | 140 | 0.5 | 20 | Spiro-MeOTAD | 5 | α-NPD | 40 | 21.9% |
| Comp. Ex. 2 | 140 | 0.5 | 20 | Spiro-MeOTAD | 5 | α-NPD | 190 | 23.0% |
| Comp. Ex. 3 | 140 | 0.5 | 20 | Spiro-MeOTAD | 10 | α-NPD | 40 | 21.5% |
| Comp. Ex. 4 | 140 | 0.5 | 20 | Spiro-MeOTAD | 10 | α-NPD | 190 | 22.2% |
| Comp. Ex. 5 | 140 | 0.5 | 20 | Spiro-MeOTAD | 15 | α-NPD | 40 | 20.9% |
| Comp. Ex. 6 | 140 | 0.5 | 20 | Spiro-MeOTAD | 15 | α-NPD | 190 | 21.7% |
| Comp. Ex. 7 | 140 | 0.5 | 20 | Spiro-MeOTAD | 20 | α-NPD | 40 | 20.1% |
| Comp. Ex. 8 | 140 | 0.5 | 20 | Spiro-MeOTAD | 20 | α-NPD | 190 | 21.1% |
| Comp. Ex. 9 | 140 | 0.5 | 20 | Spiro-MeOTAD | 30 | α-NPD | 10 | 20.2% |
| Comp. Ex. 10 | 140 | 0.5 | 20 | Spiro-MeOTAD | 30 | α-NPD | 170 | 21.6% |
| Comp. Ex. 11 | 140 | 0.5 | 20 | Spiro-MeOTAD | 50 | α-NPD | 10 | 20.3% |
| Comp. Ex. 12 | 140 | 0.5 | 20 | Spiro-MeOTAD | 50 | α-NPD | 160 | 21.0% |

Figure 5:
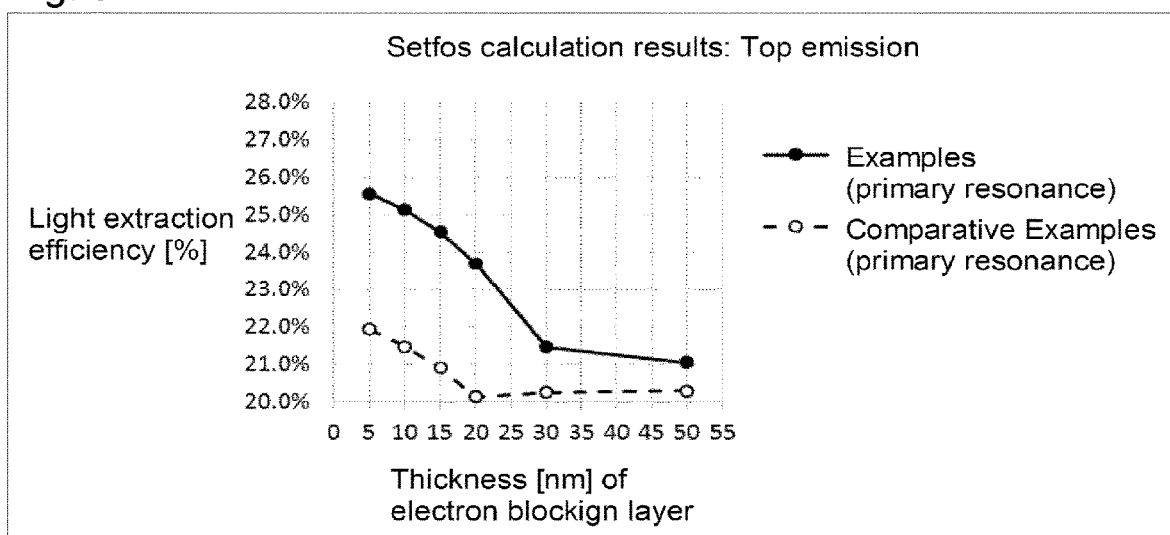
FIG. 5 is a plot showing the correlation between the film thickness of the electron blocking layer and the light extraction efficiency in Examples 1, 3, 5, 7, 9, 11 and Comparative Examples 1, 3, 5, 7, 9, 11.
Figure 6:
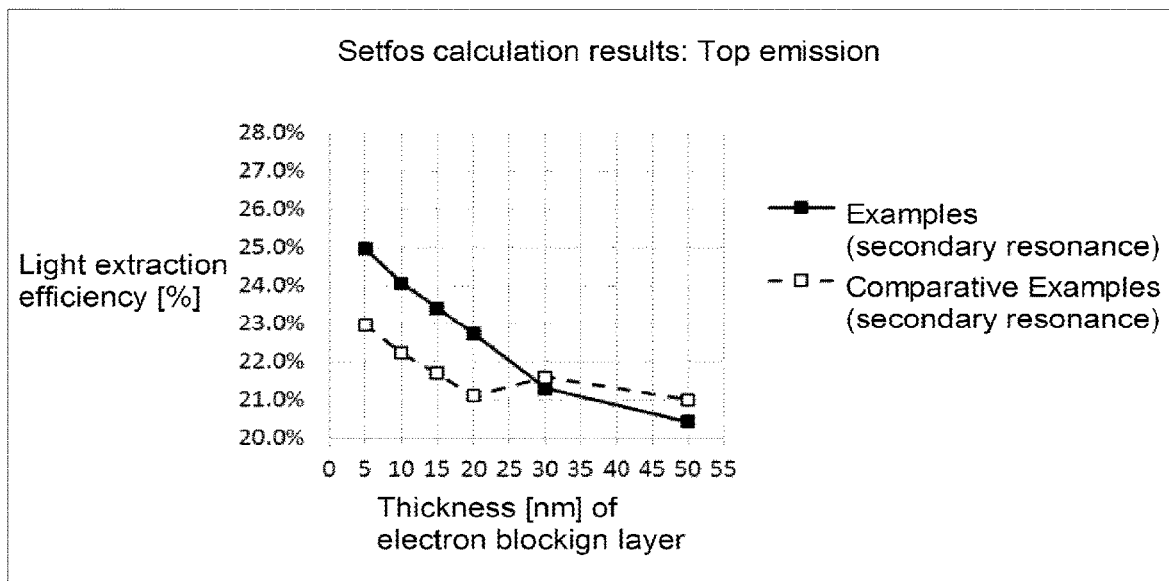
FIG. 6 is a plot showing the correlation between the film thickness of the electron blocking layer and the light extraction efficiency in Examples 2, 4, 6, 8, 10, 12 and Comparative Examples 2, 4, 6, 8, 10, 12.

From the results in Table 1 and the simulation in FIGS. 5 and 6, it has been shown that when the hole transport layer 13 becomes to have a low refractive index in the range where the thickness of the electron blocking layer is at most 20 nm, the effect to improve light extraction efficiency appears significantly.

According to the organic EL element 1 having the above-described construction, it is possible to provide an organic EL element excellent in light emission characteristics and long-term reliability.

Second Embodiment

Figure 4:
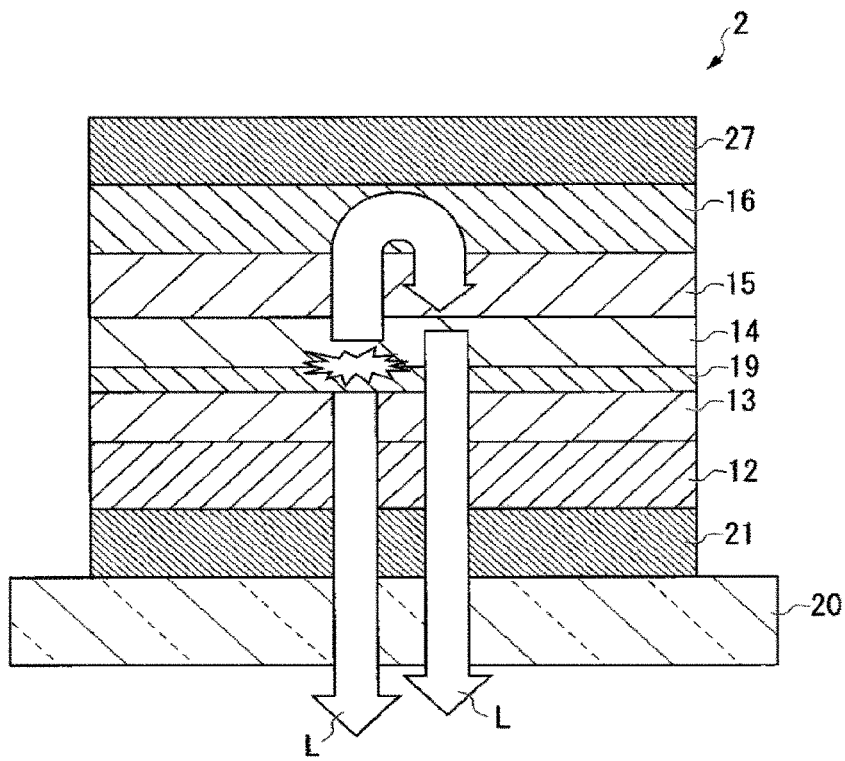
FIG. 4 is a schematic cross-sectional view showing organic EL element 2 according to the second embodiment of the present invention.

FIG. 4 is a schematic cross-sectional view of organic EL element 2 according to a second embodiment of the present invention, which is a view corresponding to FIG. 1. Therefore, the same reference numerals are given for the components in this embodiment common to the first embodiment, and their detailed description has been omitted.

The organic EL element 2 has a structure in which a substrate 20, an anode 21, a hole injection layer 12, a hole transport layer 13, an electron blocking layer 19, a light emitting layer 14, an electron transport layer 15, an electron injection layer 16 and a cathode 27 are laminated in this order. The organic EL element 2 in this embodiment adopts a bottom emission system in which light L generated in the light emitting layer 14 is emitted to the outside via the anode 21 and the substrate 20.

The substrate 20 is provided with optical transparency. As the material for forming the substrate 20, it is possible to use an inorganic substance such as glass, quartz glass or silicon nitride, or an organic polymer (resin) such as an acrylic resin The anode 21 is formed on the substrate 20 and supplies holes to the hole transport layer 13. As the material for forming the anode 21, it is possible to use an electrically conductive metal oxide having an optical transparency such as ITO or IZO.

The cathode 27 is formed in contact with the electron injection layer 16. The cathode 27 has a function to reflect light L to be isotropically emitted in the light emitting layer 14 and to direct it towards the anode 21.

The thickness of the cathode 27 is not particularly limited, but is preferably from 30 to 300 nm. The thickness of the cathode 27 is, for example, 100 nm.

Also in the organic EL element 2 having such a construction, by the function of the electron blocking layer 19 as described above, the effect to improve such a possibility that recombination of holes and electrons will occur in the light emitting layer 14, can be expected. Therefore, it is possible to obtain an organic EL element 2 excellent in light emitting characteristics and long-term reliability.

In order to verify such an effect that light extraction efficiency is improved as the hole transport layer 13 becomes to have a low refractive index as it contains a fluorinated polymer, the results of simulation using Setfos4.6 (manufactured by Cybernet Systems Co., Ltd.)) will be described. The construction of an element to be analyzed as an example of the organic EL element 2 was such that the substrate 20 was a glass (thickness 1 mm), the anode 21 was ITO (thickness 100 nm), the hole injection layer 12 was HAT-CN (thickness 10 nm), the electron blocking layer 19 was spiro-MeOTAD (thickness 5 nm, 10 nm, 15 nm, 30 nm, 50 nm), the light emitting layer 14 was composed of Ir (ppy) as an emitting guest and CBP (thickness 30 nm) as an emitting host, the electron transport layer 15 was TPBi (50 nm), the electron injection layer 16 was LiF (thickness 0.8 nm), and the cathode 27 was Al (thickness 100 nm). With respect to the hole transport layer 13, a construction in which a Low-n-HTL layer (refractive index at a wavelength of 550 nm is 1.55) being a low refractive index hole transport layer is used as the hole transport layer, was adopted in Examples 13 to 17, and a construction in which an α-NPD layer (refractive index at a wavelength of 550 nm is 1.77) is used as the hole transport layer, was adopted in Comparative Examples 13 to 17. In the simulation, by sweeping the thickness of the electron transport layer 15 and the thickness of the hole transport layer 13 at 10 nm intervals in the range of from 10 nm to 100 nm, the conditions under which the light extraction efficiency becomes to be maximum, were calculated. The results of the analysis are shown in Table 2 and FIG. 7.

TABLE 2

| Second embodiment Bottom emission | Electron transport layer Thickness nm | Light emitting layer Light emitting point | Light emitting layer Thickness nm | Electron blocking layer Material | Electron blocking layer Thickness nm | Hole transport layer Material | Hole transport layer Thickness nm | Light extraction efficiency (maximum value) |
|---|---|---|---|---|---|---|---|---|
| Ex. 13 | 50 | 0.5 | 30 | Spiro-MeOTAD | 5 | Low-n-HTL | 50 | 28.6% |
| Ex. 14 | 50 | 0.5 | 30 | Spiro-MeOTAD | 10 | Low-n-HTL | 40 | 27.8% |
| Ex. 15 | 50 | 0.5 | 30 | Spiro-MeOTAD | 15 | Low-n-HTL | 40 | 27.3% |
| Ex. 16 | 50 | 0.5 | 30 | Spiro-MeOTAD | 30 | Low-n-HTL | 20 | 26.0% |
| Ex. 17 | 50 | 0.5 | 30 | Spiro-MeOTAD | 50 | Low-n-HTL | 10 | 24.5% |
| Comp. Ex. 13 | 60 | 0.5 | 30 | Spiro-MeOTAD | 5 | α-NPD | 20 | 24.0% |
| Comp. Ex. 14 | 60 | 0.5 | 30 | Spiro-MeOTAD | 10 | α-NPD | 10 | 24.0% |
| Comp. Ex. 15 | 60 | 0.5 | 30 | Spiro-MeOTAD | 15 | α-NPD | 10 | 24.2% |
| Comp. Ex. 16 | 50 | 0.5 | 30 | Spiro-MeOTAD | 30 | α-NPD | 10 | 24.6% |
| Comp. Ex. 17 | 50 | 0.5 | 30 | Spiro-MeOTAD | 50 | α-NPD | 10 | 24.0% |

Figure 7:
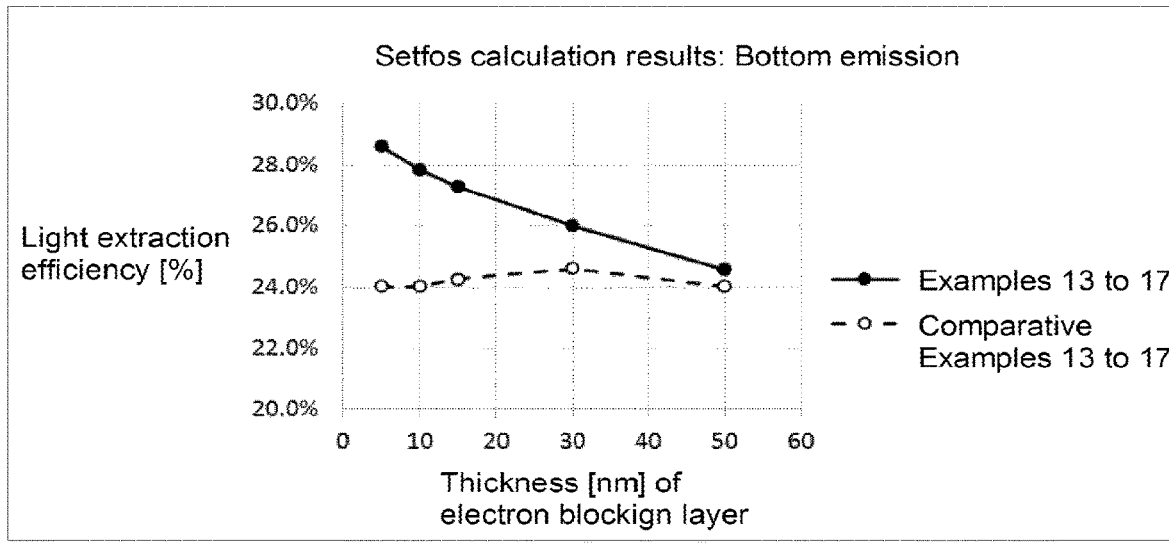
FIG. 7 is a plot showing the correlation between the film thickness of the electron blocking layer and the light extraction efficiency in Examples 13 to 17 and Comparative Examples 13 to 17.

From the results in Table 2 and the simulation in FIG. 7, it has been shown that when the hole transport layer 13 becomes to have a low refractive index in a region where the thickness of the electron blocking layer is at most 30 nm, the effect to improve light extraction efficiency appears significantly.

The measurements of the refractive index, weight average molecular weight, intrinsic viscosity and saturated vapor pressure of the fluorinated polymer in this embodiment, were carried out in accordance with the following description.

"Method of Measuring Refractive Index of Fluorinated Polymer"

Measured in accordance with JIS K7142.

"Method of Measuring Weight Average Molecular Weight of Fluorinated Polymer"

The weight average molecular weight of a fluorinated polymer is measured by using gel permeation chromatography (GPC). First, PMMA standard samples having known molecular weights are measured by using GPC, and from the elution time and molecular weight of the peak top, a calibration curve is prepared. Then, the fluorinated polymer is measured, and from the calibration curve, Mw and Mn are obtained. As the mobile phase solvent, a mixed solvent of 1,1,1,2,3,4,4,5,5,5-decafluoro-3-methoxy-2-(trifluoromethyl) pentane/hexafluoroisopropyl alcohol (volume ratio 85/15) is used.

"Method of Measuring Intrinsic Viscosity [η] of Fluorinated Polymer"

The intrinsic viscosity [η] of a fluorinated polymer is measured by Ubbelohde viscometer (manufactured by Shibata Scientific Technology Ltd., viscometer Ubbelohde) at a measuring temperature of 30° C. by using ASAHIKLIN (registered trademark) AC2000 (manufactured by Asahi Glass Company, Limited) as the solvent.

"Method of Measuring Evaporation Rate and Saturated Vapor Pressure of Fluorinated Polymer"

The evaporation rate and saturated vapor pressure at 300° C. are measured by using a vacuum differential thermal balance (manufactured by Advance Riko Inc.: VPE-9000).

50 mg of a fluorinated polymer was charged into a cell having an inner diameter of 7 mm, and under a vacuum degree of $1 \times 10^{-3}$ Pa, the temperature was raised at a rate of 2° C. per minute, whereby the evaporation rate $g/m^2$ sec at 300° C. was measured. For the calculation of the saturation vapor pressure, the evaporation rate and Mw obtained by the above GPC measurement were used.

The measurement of the refractive index of the charge transport layer in this embodiment, and evaluation of the characteristics of the element prepared in this embodiment are carried out in accordance with the following description.

"Method of Measuring Refractive Index of Charge Transport Layer"

Using a multi incidence angle spectroscopic ellipsometry (manufactured by J.A. Woollam Co., Inc.: M-2000U), with respect to a film on a silicon substrate, the measurement is carried out by changing the incident angle of light by 5° every time, in a range of from 45 to 75°. At each angle, ψ and Δ being ellipsometric parameters are measured at about 1.6 nm intervals in a range of wavelength region of from 450 to 800 nm. Using the above measurement data, the dielectric function of the organic semiconductor is subjected to a fitting analysis by Cauchy model to obtain the refractive index and extinction coefficient of the charge injection layer to light of each wavelength.

"Evaluation of J-V Characteristics of Element for Evaluation of Electrical Conductivity"

By a source meter (manufactured by Keithley, Keithley (registered trademark) 2401), while applying a voltage by setting the ITO (indium tin oxide) side as an anode and the aluminum side as the cathode, the current flowing in an element for evaluation of electrical conductivity was measured at each voltage.

Abbreviations of the monomers, solvents and polymerization initiators used in the production of the following fluorinated polymers, are as follows.

BVE: perfluoro(3-butenyl vinyl ether)
TFE: tetrafluoroethylene
PPVE: perfluoro vinyl ether ($CF_2$=$CFOCF_2CF_2CF_3$)
AIBN: azobisisobutyronitrile
1H-PFH: 1,1,1,2,2,3,3,4,4,5,5,6,6-tridecafluorohexane
IPP: diisopropyl peroxydicarbonate <Synthesis of fluorinated polymer A>30 g of BVE, 30 g of IH-PFH, 0.5 g of methanol and 0.44 g of IPP were put in a glass reactor having an inner volume of 50 ml. After replacing inside of the system by high purity nitrogen gas, and polymerization was carried out at 40° C. for 24 hours. The obtained solution was subjected to solvent removal under conditions of 666 Pa (absolute pressure) at 50° C., to obtain 28 g of a fluorinated polymer. The intrinsic viscosity [η] of the obtained fluorinated polymer was 0.04 dl/g.

Then, the obtained fluorinated polymer was subjected to substitution of unstable terminal groups by —$CF_3$ groups by fluorine gas, in accordance with the method described in paragraph [0040] of JP-A-H11-152310, to obtain fluorinated polymer A.

Of the obtained fluorinated polymer A, the refractive index to light having a wavelength of 600 nm was 1.34, and the intrinsic viscosity [η] was 0.04 dl/g. Of the fluorinated polymer A, Mw was 9,000, Mn was 6,000, Mw/Mn was 1.5, the saturated vapor pressure at 300° C. was 0.002 Pa, and the evaporation rate at 300° C. was 0.08 $g/m^2$ sec.

<Synthesis of Fluorinated Polymer B>

Into a stainless steel autoclave having an internal volume of 1,006 mL, 152.89 g of PPVE, 805.0 g of AC2000, 2.400 g of methanol, and 1.149 g of AIBN were charged and freeze-degassed by liquid nitrogen. After the temperature was raised to 70° C., TFE was introduced until the pressure became 0.57 MPaG. While maintaining the temperature and pressure to be constant, TFE was continuously supplied for polymerization. After 9 hours from the initiation of the polymerization, the autoclave was cooled to stop the polymerization reaction, and the gas in the system was purged to obtain a solution of a fluorinated polymer.

813 g of methanol was added to the solution of the fluorinated polymer, followed by mixing, and a lower layer in which the fluorinated polymer was dispersed, was recovered. The obtained fluorinated polymer dispersion was hot-air dried at 80° C. for 16 hours, and then vacuum dried at 100° C. for 16 hours, to obtain 18.92 g of the fluorinated polymer.

The composition of the fluorinated polymer was PPVE:TFE=14:86 mol %.

Figure 8:
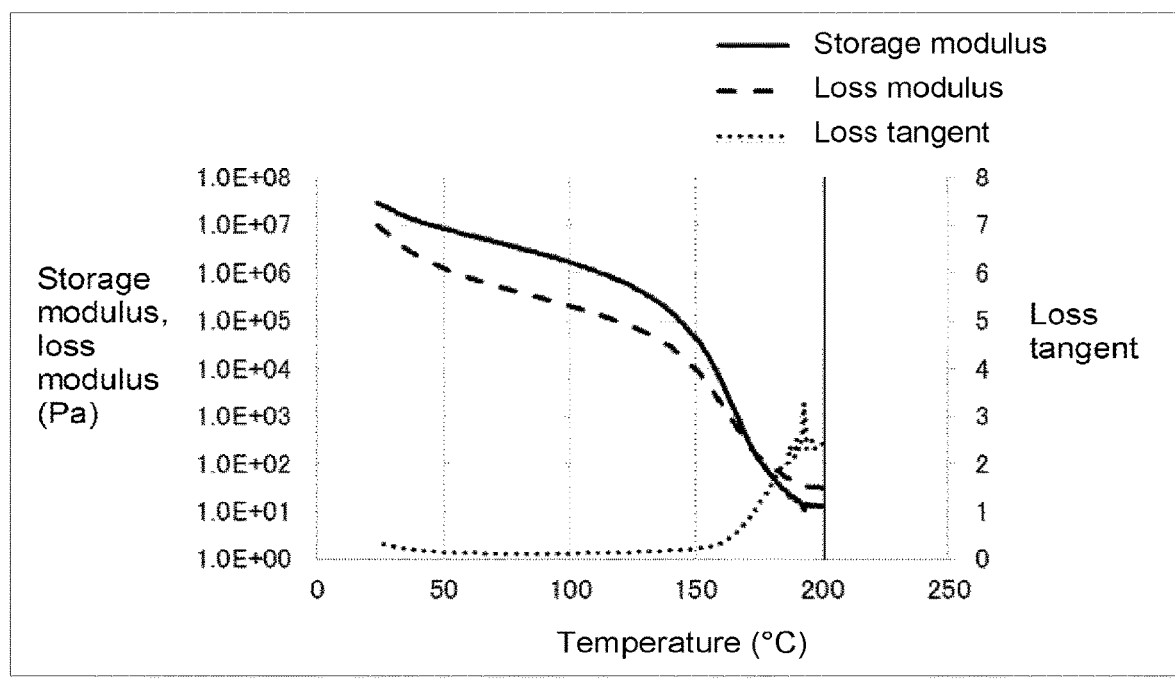
FIG. 8 is a graph showing the relationship between the elastic modulus of the polymer B and the temperature.

Then, the obtained fluorinated polymer was heated in an oven of 330° C. for 5 hours, then immersed in methanol, and heated in an oven of 75° C. for 20 hours, to substitute unstable terminal groups by methyl ester groups, thereby to obtain fluorinated polymer B. By the above-mentioned methods, Mw and Mn of the fluorinated polymer B cannot be measured, and therefore, instead, the relation of the elastic modulus and temperature of the polymer B is shown in FIG. 8.

Of the obtained polymer B, the refractive index to light having a wavelength of 600 nm was 1.34, and the evaporation rate at 300° C. was 0.04 $g/m^2$ sec.

From the results of the simulations in the first and second embodiments, it has been shown that as the thickness of the electron blocking layer 19 is thinner, the effect of reducing the refractive index of the hole transport layer 13 appears largely, but, on the one hand, it is worried that as the electron blocking layer becomes to be thinner, the electron blocking property becomes weak, whereby electrons tend to leak.

The following test of an electron only device (EOD) was conducted to evaluate the degree of leakage of electrons under such a condition that the thickness of the electron blocking layer 19 is as thin as 10 nm.

Example 18

<Preparation of Electron Only Device (EOD)>

As a substrate for preparing EOD for evaluation of the electron blocking property, a glass substrate having ITO (indium tin oxide) film-deposited in a strip shape with a width of 2 mm was used. The substrate was subjected to ultrasonic cleaning by using a neutral detergent, acetone and isopropyl alcohol, and further boil-washed in isopropyl alcohol, whereupon deposits on the ITO film surface were removed by ozone treatment. This substrate was placed in a vacuum vapor deposition machine and evacuated to a pressure of at most $10^{-4}$ Pa, whereupon as a hole blocking layer, TPBi was subjected to resistance heating in the vacuum deposition machine and was vapor-deposited in a thickness of 10 nm at a vapor deposition rate of 0.1 nm/sec. Thereafter, as a hole transport layer, α-NPD and fluorinated polymer A were subjected to resistance heating and co-vapor deposition in a vacuum vapor deposition machine, so that the volume ratio of α-NPD and the fluorinated polymer A would become 50:50, whereby a co-deposited film A was formed in a thickness of 100 nm. The total deposition rate of the two materials was set to be 0.2 nm/s. Thereafter, as an electron blocking layer, spiro-MeOTAD was vapor-deposited in 10 nm at a deposition rate of 0.1 nm/sec; as an electron injection layer, TPBi was vapor-deposited in 5 nm at a deposition rate of 0.1 nm/sec, and LiF was vapor-deposited in 0.8 nm at a deposition rate of 0.1 nm/sec; and finally aluminum was vapor-deposited by resistance heating in a strip shape with a width of 2 mm, to obtain an element for evaluation of electrical conductivity. 2 mm×2 mm in which ITO with a width of 2 mm and aluminum with a width of 2 mm are crossed, becomes to be the element area.

Example 19

EOD was prepared in the same manner as in Example 18, except that co-deposition film B was formed in 100 nm, by subjecting α-NPD and fluorinated polymer B, as a hole transport layer, to resistance heating and co-vapor deposition in a vacuum deposition machine so that the volume ratio of α-NPD and fluorinated polymer B would become 50:50.

Comparative Example 18

EOD was prepared in the same manner as in Example 18, except that spiro-MeOTAD was not vapor-deposited as the electron blocking layer.

Comparative Example 19

EOD was prepared in the same manner as in Example 19, except that spiro-MeOTAD was not vapor-deposited as the electron blocking layer.

Comparative Example 20

EOD was prepared in the same manner as in Example 18, except that only α-NPD was vapor-deposited in 100 nm as the hole transport layer.

Comparative Example 21

EOD was prepared in the same manner as in Comparative Example 20, except that spiro-MeOTAD was not vapor-deposited as the electron blocking layer.

Example 20

A silicon substrate cut into about 2 cm square was subjected to ultrasonic cleaning by using a neutral detergent, acetone and isopropanol, and further boil-washed in isopropanol, whereupon deposits on the substrate surface were removed by ozone treatment. This substrate was placed in a vacuum deposition machine, and evacuated under a pressure of at most $10^{-4}$ Pa, whereupon fluorinated polymer A and α-NPD were subjected to resistance heating and co-vapor deposition in the vacuum vapor deposition machine, so that the volume ratio would become 50:50, to form hole transport layer with a thickness of about 100 nm. The refractive index to light having a wavelength of 600 nm, of the obtained hole transport layer, was 1.55.

Example 21

A hole transport layer was deposited in the same manner as in Example 20 except that fluorinated polymer B was used instead of fluorinated polymer A. The refractive index to light having a wavelength of 600 nm, of the obtained hole transport layer, was 1.55.

Comparative Example 22

A hole transport layer was deposited in the same manner as in Example 20 except that as the hole transport layer, only α-NDP was deposited in about 100 nm. The refractive index to light having a wavelength of 600 nm, of the obtained hole transport layer, was 1.78.

By Example 20, Example 21 and Comparative Example 22, it has been confirmed that by co-vapor depositing α-NPD and the fluorinated polymer so that the volume ratio would become 50:50, the refractive index is lowered from 1.78 to 1.55.

In order to verify the electron blocking property of EOD in Examples 18 to 19 and Comparative Examples 18 to 21, evaluation of electrical conductivity of electrons was conducted. The construction of each EOD is shown in Table 3, and the values of the current densities when voltages of 6 V and 8 V were applied to each EOD are shown in Table 4.

TABLE 4

| | Current density [mA/cm²] | |
|---|---|---|
| | 6 V | 8 V |
| Ex. 18 | 1.E−06 | 2.E−05 |
| Ex. 19 | 1.E−06 | 2.E−05 |
| Comp. Ex. 18 | 1.E−05 | 3.E−04 |
| Comp. Ex. 19 | 1.E−05 | 3.E−04 |
| Comp. Ex. 20 | 1.E−04 | 6.E−04 |
| Comp. Ex. 21 | 4.E−04 | 5.E−03 |

From the results in Tables 3 and 4, it has been confirmed that the current density is lowered nearly by an order of magnitude by forming spiro-MeOTAD as an electron blocking layer, and it has been confirmed that electrons are blocked even when the thickness is 10 nm. However, surprisingly, it has been confirmed that by using, as a hole transport layer, co-vapor deposition film A containing fluorinated polymer A or co-vapor deposition film B containing fluorinated polymer B, the current density is further lowered, and the electron blocking property becomes stronger. From this result, it is considered that electrons leaked from spiro-MeOTAD are present but slightly, and the leaked electrons are trapped by the fluorinated resin. As the fluorinated resin traps the leaked electrons, it is expected to suppress quenching by recombination of holes and electrons in the hole transport layer, thereby to improve the light emitting efficiency.

The above-described organic photoelectronic element in this embodiment can be utilized for organic photoelectronic devices such as organic EL devices, solar cells, organic photodiodes and organic lasers.

Especially, the organic photoelectronic element of this embodiment may be suitably used as an organic EL element. Such an organic EL element can be utilized for organic EL devices such as organic EL displays and organic EL illumination. These organic EL devices may be a top emission type, or may be a bottom emission type.

In the foregoing, preferred embodiments according to the present invention have been described with reference to the accompanying drawings, but, needless to say, the present invention is not limited to such embodiments. Various shapes and combinations of the respective components

TABLE 3

| | Ex. 18 | Ex. 19 | Comp. Ex. 18 | Comp. Ex. 19 | Comp. Ex. 20 | Comp. Ex. 21 |
|---|---|---|---|---|---|---|
| Cathode | Al (80 nm) | Al (80 nm) | Al (80 nm) | Al (80 nm) | Al (80 nm) | Al (80 nm) |
| Electron injection layer | LiF (0.8 nm) | LiF (0.8 nm) | LiF (0.8 nm) | LiF (0.8 nm) | LiF (0.8 nm) | LiF (0.8 nm) |
| Electron injection layer | TPBi (5 nm) | TPBi (5 nm) | TPBi (5 nm) | TPBi (5 nm) | TPBi (5 nm) | TPBi (5 nm) |
| Electron blocking layer | Spiro-MeOTAD (10 nm) | Spiro-MeOTAD (10 nm) | — | — | Spiro-MeOTAD (10 nm) | — |
| Hole transport layer | Co-vapor deposition film A (100 nm) | Co-vapor deposition film B (100 nm) | Co-vapor deposition film A (100 nm) | Co-vapor deposition film B (100 nm) | α-NPD (100 nm) | α-NPD (100 nm) |
| Hole blocking layer | TPBi (10 nm) | TPBi (10 nm) | TPBi (10 nm) | TPBi (10 nm) | TPBi (10 nm) | TPBi (10 nm) |
| Anode | ITO (100 nm) | ITO (100 nm) | ITO (100 nm) | ITO (100 nm) | ITO (100 nm) | ITO (100 nm) | described in the above-described embodiments are merely examples, and various modifications are possible based on design requirements without departing from the scope of the present invention.

This application is a continuation of PCT Application No. PCT/JP2018/031235, filed on Aug. 23, 2018, which is based upon and claims the benefit of priority from Japanese Patent Application No. 2017-161639 filed on Aug. 24, 2017. The contents of those applications are incorporated herein by reference in their entireties.

REFERENCE SYMBOLS 10, 20: substrate, 11, 21: anode, 13: hole transport layer, 14: light emitting layer, 17, 27: cathode, 19: electron blocking layer, E: electron, H: hole, L: light

What is claimed is:

1. An organic photoelectronic element, comprising:
a substrate;
an anode provided on the substrate;
a cathode facing the anode;
a light emitting layer disposed between the anode and the cathode;
a hole transport layer disposed between the light emitting layer and the anode; and
an electron blocking layer provided in contact with the light emitting layer and the hole transport layer between the light emitting layer and the hole transport layer, wherein
the hole transport layer contains a fluorinated polymer and an organic semiconductor material, and has a refractive index in a wavelength range of from 450 nm to 800 nm, of at most 1.60,
the hole transport layer and the electron blocking layer are made of different materials from each other, and
a LUMO energy level of the electron blocking layer is higher than a LUMO energy level of the light emitting layer and a LUMO energy level of the hole transport layer.

2. The organic photoelectronic element according to claim 1, wherein an energy difference between the LUMO energy level of the electron blocking layer and the LUMO energy level of the light emitting layer is larger than an energy difference between the LUMO energy level of the hole transport layer and the LUMO energy level of the electron blocking layer.

3. The organic photoelectronic element according to claim 1, wherein an energy difference between the LUMO energy level of the electron blocking layer and the LUMO energy level of the light emitting layer, is larger than 0.5 eV.

4. The organic photoelectronic element according to claim 1, wherein a film thickness of the electron blocking layer is from 5 nm to 30 nm.

5. The organic photoelectronic element according to claim 1, wherein a volume ratio of a content (A) of the fluorinated polymer to a content (B) of the organic semiconductor material in the hole transport layer, (A):(B), is from 70:30 to 5:95.

6. The organic photoelectronic element according to claim 1, wherein the refractive index in the wavelength range of from 450 nm to 800 nm of the fluorinated polymer is at most 1.50.

7. The organic photoelectronic element according to claim 1, wherein an evaporation rate at 300° C. in a vacuum degree of $1\times10^{-3}$ Pa, of the fluorinated polymer, is at least 0.01 $g/m^2$ sec.

8. The organic photoelectronic element according to claim 1, wherein a weight average molecular weight of the fluorinated polymer is from 1,500 to 50,000.

9. The organic photoelectronic element according to claim 1, wherein the fluorinated polymer is a polymer which does not have an aliphatic ring in a main chain and has units derived from a fluoroolefin in the main chain, or a polymer which has an aliphatic ring structure in the main chain.

10. The organic photoelectronic element according to claim 9, wherein the fluorinated polymer is a perfluoropolymer having an aliphatic ring structure in the main chain.

11. The organic photoelectronic element according to claim 10, wherein the perfluoropolymer is polyperfluoro(3-butenyl vinyl ether).

12. The organic photoelectronic element according to claim 11, wherein an intrinsic viscosity of the polyperfluoro (3-butenyl vinyl ether) is from 0.01 to 0.14 dl/g.

13. The organic photoelectronic element according to claim 1, wherein the hole transport layer is a physical vapor deposition layer.

14. The organic photoelectronic element according to claim 1, further comprising:
a hole injection layer disposed between the hole transport layer and the anode and containing a semiconductor material and a fluorinated polymer.

15. The organic photoelectronic element according to claim 1, wherein the organic photoelectronic element is an organic electroluminescent (EL) element.

* * * * *